US009577095B2

(12) United States Patent
Uejima et al.

(10) Patent No.: US 9,577,095 B2
(45) Date of Patent: Feb. 21, 2017

(54) SEMICONDUCTOR DEVICE

(71) Applicant: RENESAS ELECTRONICS CORPORATION, Kanagawa (JP)

(72) Inventors: Kazuya Uejima, Tokyo (JP); Hidetatsu Nakamura, Tokyo (JP); Akihito Sakakidani, Kanagawa (JP); Eiichirou Watanabe, Kanagawa (JP)

(73) Assignee: RENESAS ELECTRONICS CORPORATION, Kanagawa (JP)

( * ) Notice: Subject to any disclaimer, the term of this patent is extended or adjusted under 35 U.S.C. 154(b) by 0 days.

(21) Appl. No.: 14/700,461

(22) Filed: Apr. 30, 2015

(65) Prior Publication Data
US 2015/0236156 A1    Aug. 20, 2015

Related U.S. Application Data

(62) Division of application No. 13/408,082, filed on Feb. 29, 2012, now abandoned, which is a division of
(Continued)

(30) Foreign Application Priority Data

Jun. 8, 2006 (JP) ................................. 2006-159779

(51) Int. Cl.
*H01L 29/76* (2006.01)
*H01L 29/78* (2006.01)
(Continued)

(52) U.S. Cl.
CPC ....... *H01L 29/7843* (2013.01); *H01L 29/0653* (2013.01); *H01L 29/0847* (2013.01); *H01L 29/41758* (2013.01); *H01L 29/45* (2013.01)

(58) Field of Classification Search
CPC ................... H01L 21/823807; H01L 29/7843; H01L 29/45; H01L 29/0847; H01L 29/0653; H01L 29/41758
(Continued)

(56) References Cited

U.S. PATENT DOCUMENTS 5,213,990 A    5/1993 Rodder
5,428,244 A    6/1995 Segawa et al.
(Continued)

FOREIGN PATENT DOCUMENTS

JP        55-4918        1/1980
JP        5-166802       7/1993
(Continued)

OTHER PUBLICATIONS

Japanese Official Action—2008-520592—Aug. 21, 2012.
(Continued)

*Primary Examiner* — Vongsavanh Sengdara
(74) *Attorney, Agent, or Firm* — Young & Thompson

(57) ABSTRACT

A semiconductor device includes a MISFET. The semiconductor device also includes a silicon nitride film 12 and a silicon nitride film 10 arranged on the silicon nitride film 12. The silicon nitride film 12 covers at least a portion of an upper part of a source/drain 8 of the MISFET and has a film thickness thinner than a height of a gate electrode 4. The source/drain 8 includes nickel silicide 9 on its boundary to the silicon nitride film 10. The silicon nitride film 10 is a stressed film. A tight adhering property between the silicon nitride film 12 and the surface of the source/drain 8 and that between the silicon nitride film 12 and the silicon nitride film 10 are rendered higher than a tight adhering property which would prevail when the silicon nitride film 10 be made to adhere tightly to the source/drain 8.

18 Claims, 27 Drawing Sheets

Related U.S. Application Data application No. 12/303,822, filed as application No. PCT/JP2007/061382 on Jun. 5, 2007, now abandoned.

(51) Int. Cl.
  *H01L 29/45* (2006.01)
  *H01L 29/417* (2006.01)
  *H01L 29/06* (2006.01)
  *H01L 29/08* (2006.01)

(58) Field of Classification Search
  USPC .................................................. 257/374, 288
  See application file for complete search history.

(56) References Cited

U.S. PATENT DOCUMENTS

| | | | |
|---|---|---|---|
| 6,091,121 A | 7/2000 | Oda | |
| 6,236,090 B1 * | 5/2001 | Fujisawa | H01L 21/28518 257/382 |
| 6,503,826 B1 | 1/2003 | Oda | |
| 6,656,853 B2 | 12/2003 | Ito | |
| 7,078,345 B2 * | 7/2006 | Iinuma | H01L 21/28518 134/3 |
| 7,105,394 B2 * | 9/2006 | Hachimine | H01L 21/823807 257/E21.438 |
| 7,262,472 B2 | 8/2007 | Pidin | |
| 7,348,230 B2 | 3/2008 | Matsuo et al. | |
| 2002/0081794 A1 | 6/2002 | Ito | |
| 2003/0040158 A1 * | 2/2003 | Saitoh | H01L 21/823807 438/279 |
| 2003/0181005 A1 * | 9/2003 | Hachimine | H01L 21/823807 438/231 |
| 2004/0266194 A1 | 12/2004 | Iinuma | |
| 2005/0093078 A1 * | 5/2005 | Chan | H01L 21/823807 257/374 |
| 2005/0145897 A1 | 7/2005 | Matsuo et al. | |
| 2006/0091475 A1 | 5/2006 | Fujii et al. | |
| 2008/0142901 A1 | 6/2008 | Matsuo et al. | |

FOREIGN PATENT DOCUMENTS

| | | |
|---|---|---|
| JP | 6-77478 | 3/1994 |
| JP | 11-145464 | 5/1999 |
| JP | 2000-208763 | 7/2000 |
| JP | 2002-198368 | 7/2002 |
| JP | 2003-60076 | 2/2003 |
| JP | 2003-086708 | 3/2003 |
| JP | 2003-273240 | 9/2003 |
| JP | 2004-303799 | 10/2004 |
| JP | 2005-175121 | 6/2005 |
| JP | 2005-353675 | 12/2005 |
| JP | 2006-24609 | 1/2006 |
| JP | 2006-59980 | 3/2006 |
| JP | 2006-128477 | 5/2006 |
| JP | 2007-207816 | 8/2007 |
| WO | 2005098962 | 10/2005 |
| WO | 2005112127 | 11/2005 |
| WO | 2006052379 | 5/2006 |

OTHER PUBLICATIONS

C. Doughty et al., "Silicon Nitride Films Deposited At Substrate Temperatures 100 deg in a Permanent Magnet Electron Cyclotron Resonance Plasma", J. Vac. Sci. Technol. A 17(5), Sep./Oct. 1999.
P. Temple-Boyer et al., "Residual Stress in Low Pressure Chemical Vapor Deposition SiN x Films Deposited From Silane and Ammonia", 2003 J. Vac Sci. Technol. A 16(4), Jul./Aug. 1998.

* cited by examiner

FIG. 1A (FIRST EXEMPLARY EMBODIMENT)
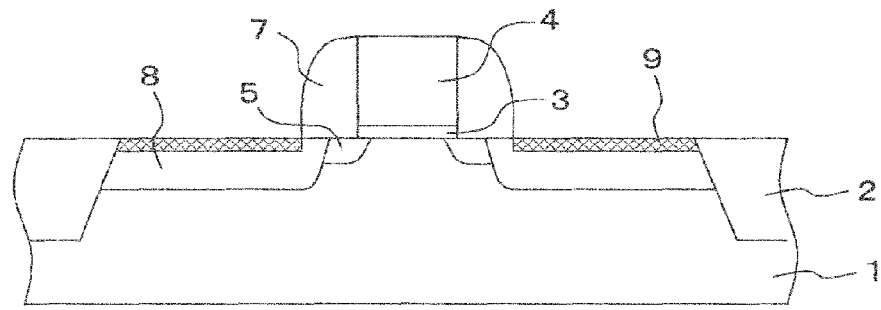
FIG. 1B (FIRST EXEMPLARY EMBODIMENT)
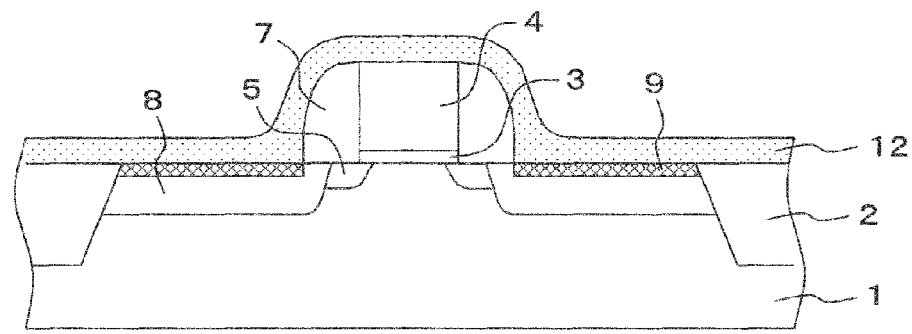
FIG. 1C (FIRST EXEMPLARY EMBODIMENT)
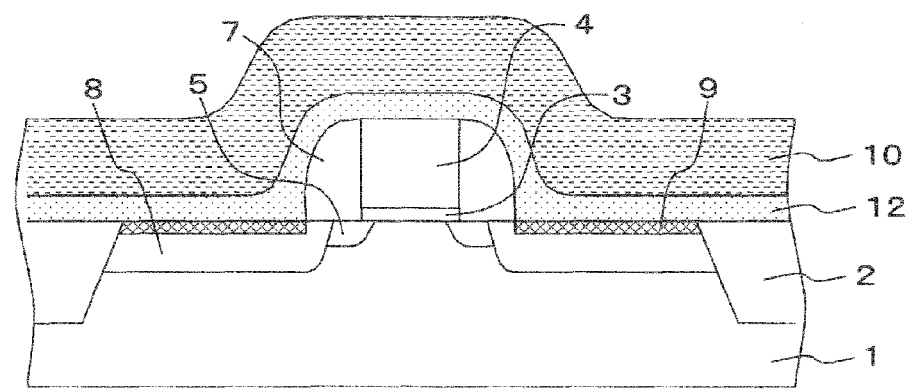

FIG. 2A (SECOND EXEMPLARY EMBODIMENT)
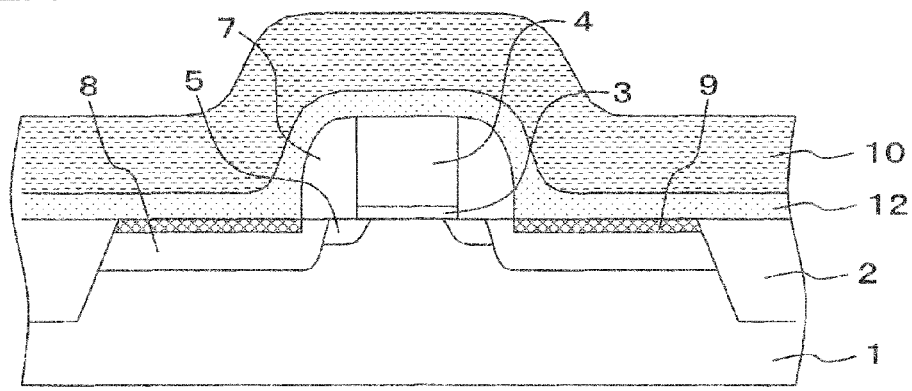
FIG. 2B (SECOND EXEMPLARY EMBODIMENT)
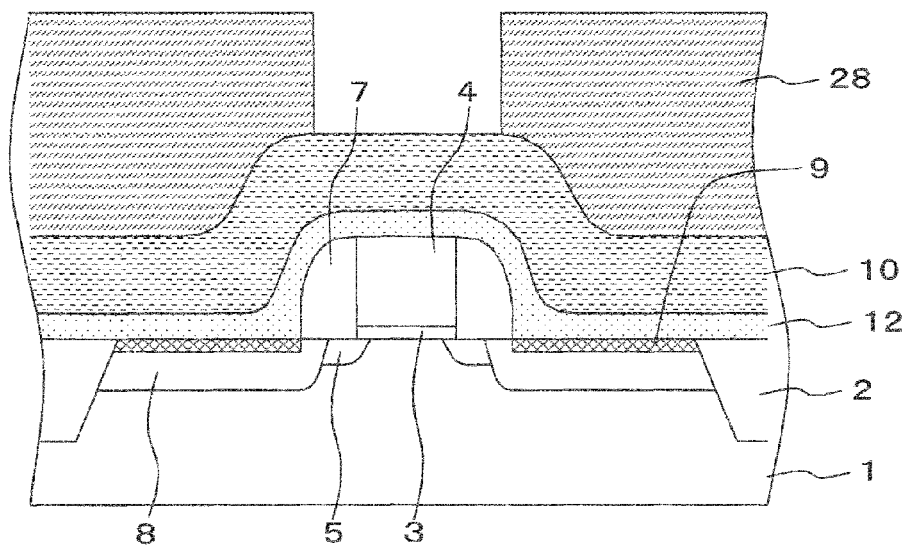
FIG. 2C (SECOND EXEMPLARY EMBODIMENT)
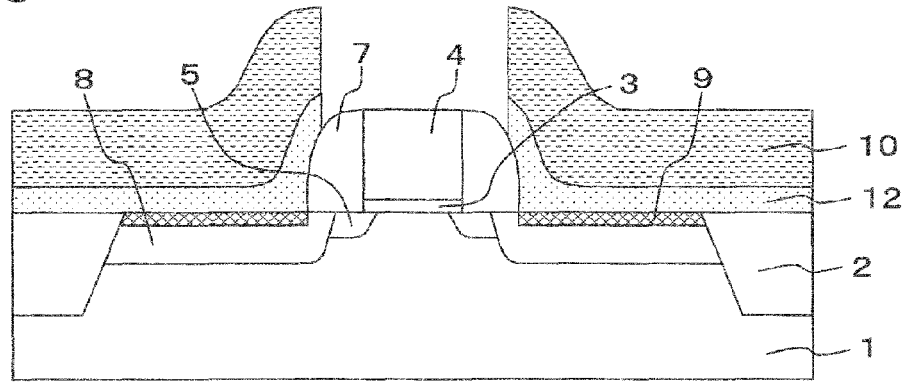

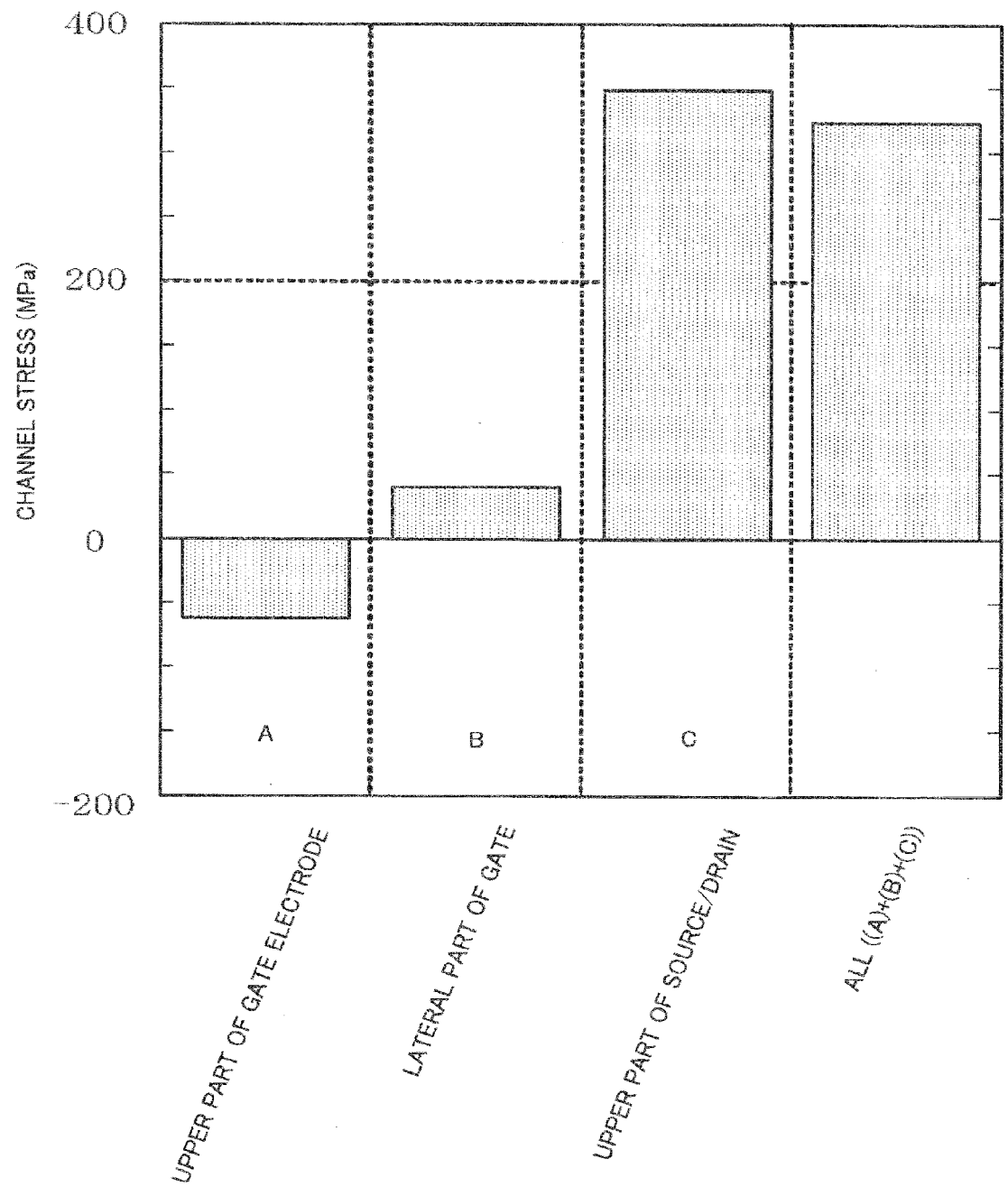
FIG. 3  (SECOND EXEMPLARY EMBODIMENT)

FIG. 4A (THIRD EXEMPLARY EMBODIMENT)
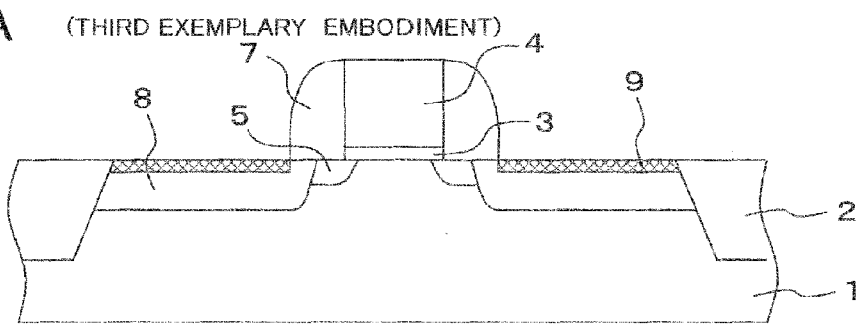
FIG. 4B (THIRD EXEMPLARY EMBODIMENT)
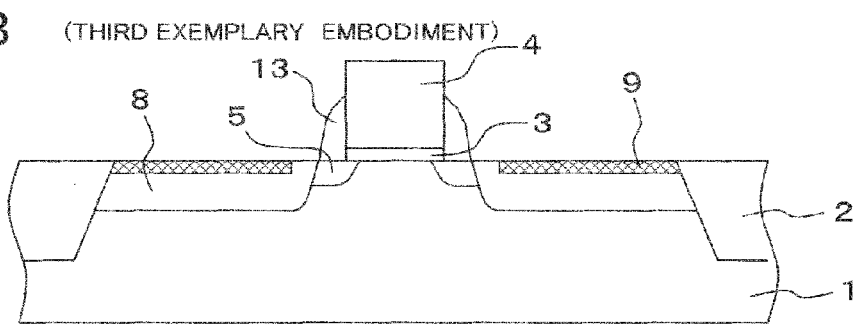
FIG. 4C (THIRD EXEMPLARY EMBODIMENT)
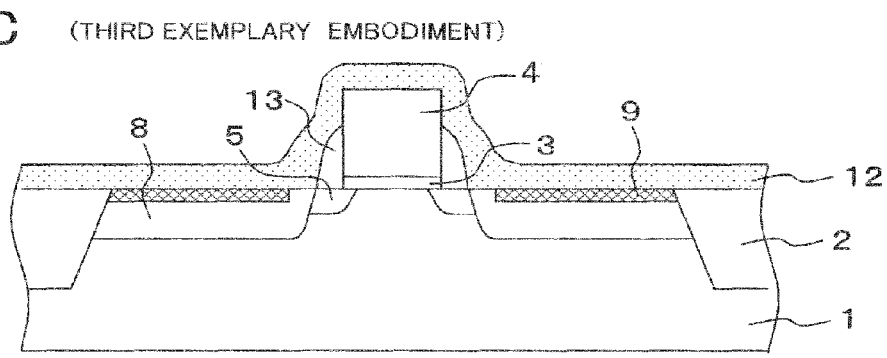
FIG. 4D (THIRD EXEMPLARY EMBODIMENT)
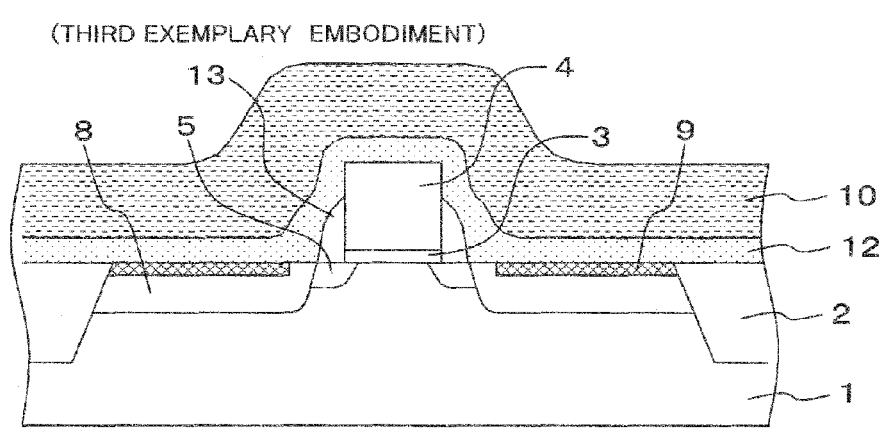

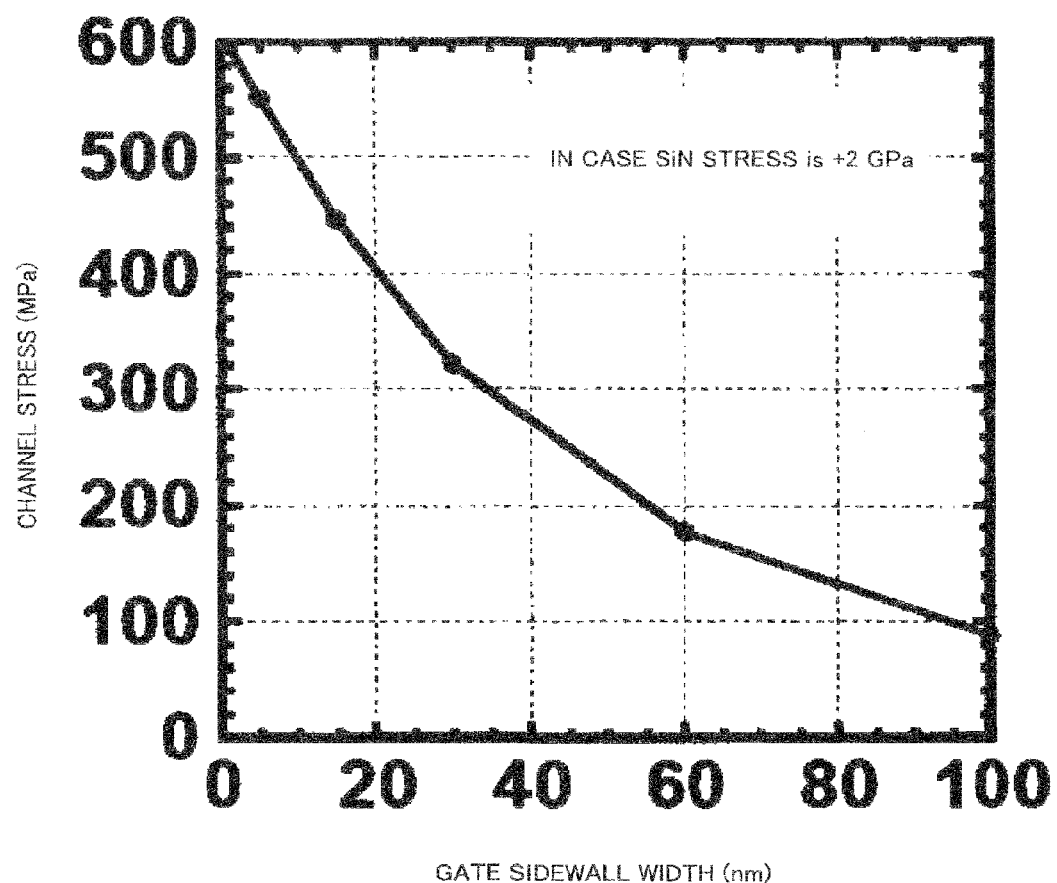
FIG. 5    (THIRD EXEMPLARY EMBODIMENT)

FIG. 6A (FOURTH EXEMPLARY EMBODIMENT)
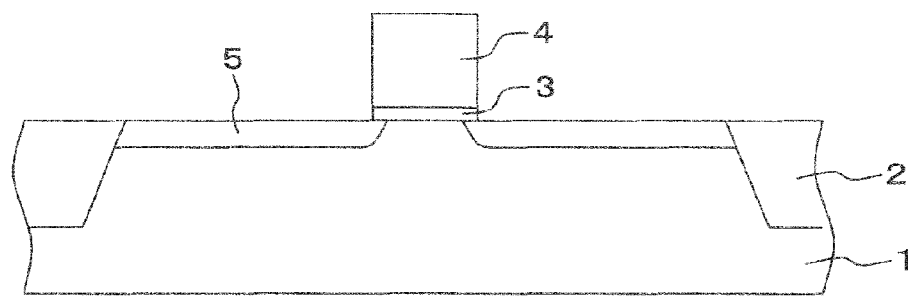
FIG. 6B (FOURTH EXEMPLARY EMBODIMENT)
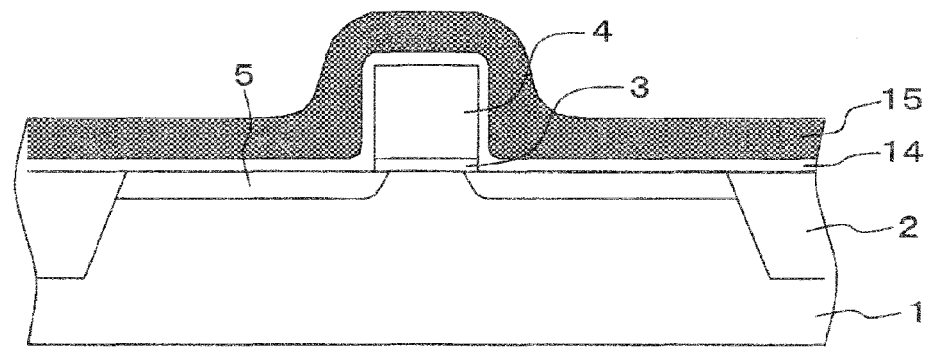
FIG. 6C (FOURTH EXEMPLARY EMBODIMENT)
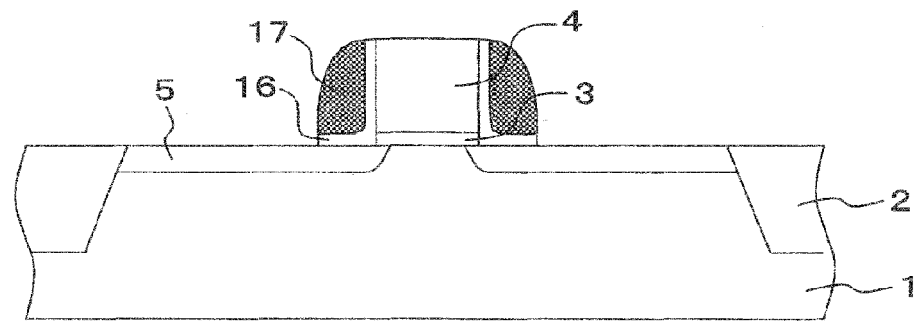

FIG. 7A (FOURTH EXEMPLARY EMBODIMENT)
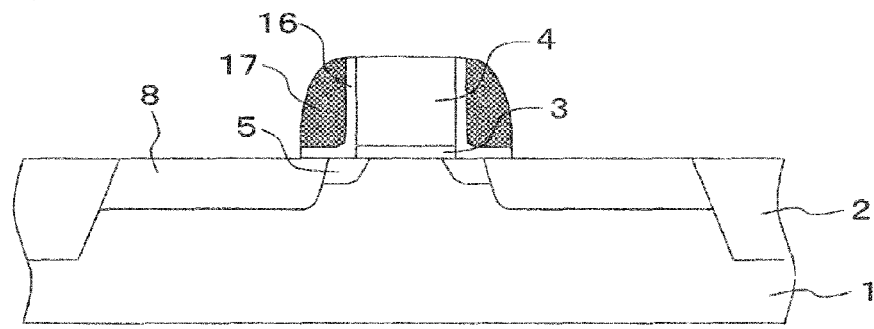
FIG. 7B (FOURTH EXEMPLARY EMBODIMENT)
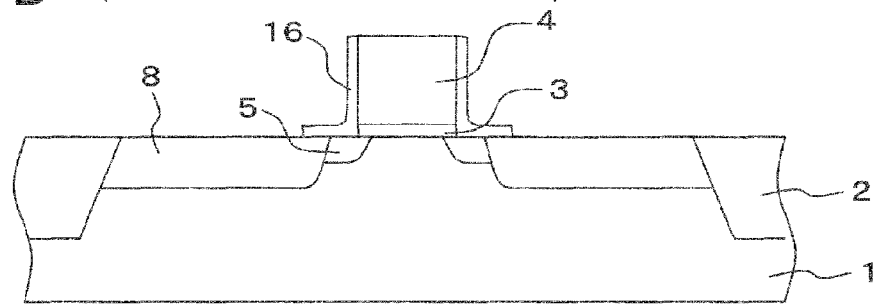
FIG. 7C (FOURTH EXEMPLARY EMBODIMENT)
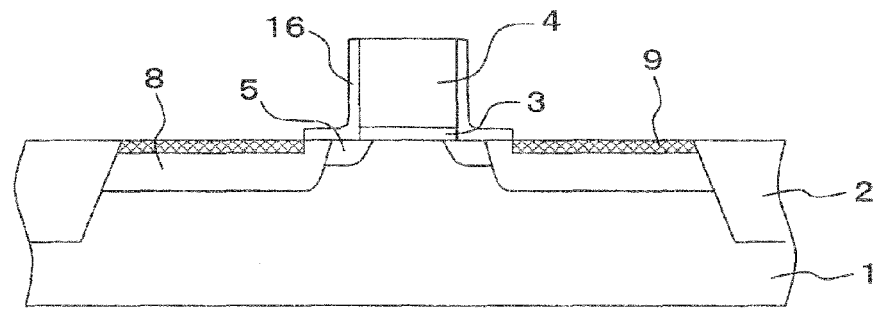

FIG. 8A (FOURTH EXEMPLARY EMBODIMENT)
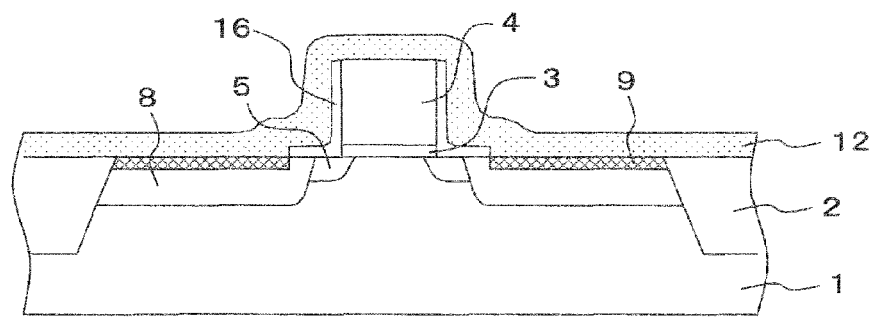
FIG. 8B (FOURTH EXEMPLARY EMBODIMENT)
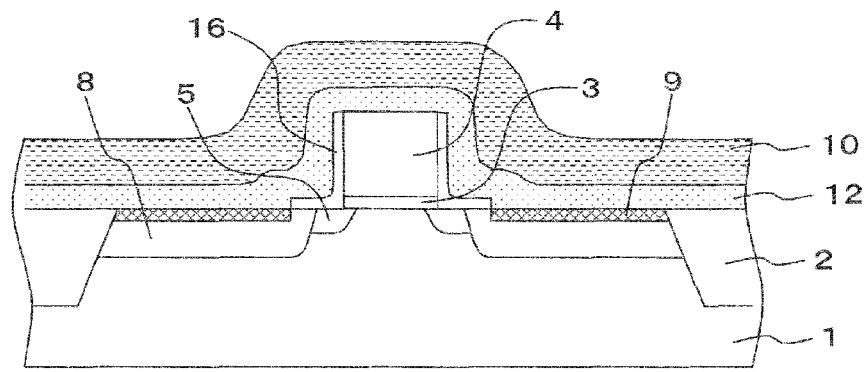

FIG. 9A (FIFTH EXEMPLARY EMBODIMENT)
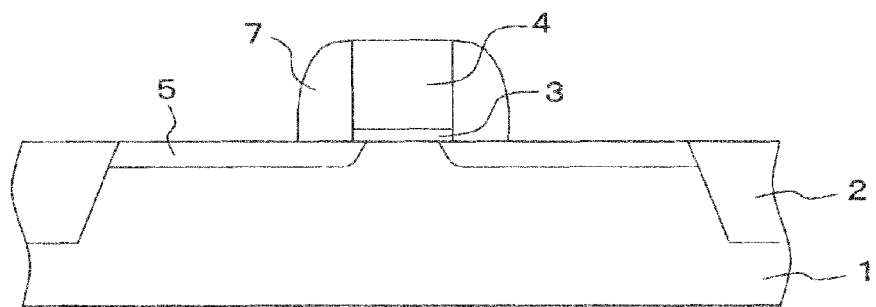
FIG. 9B (FIFTH EXEMPLARY EMBODIMENT)
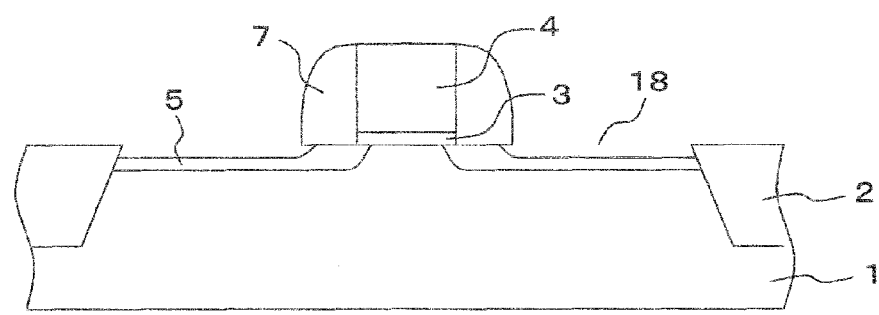
FIG. 9C (FIFTH EXEMPLARY EMBODIMENT)
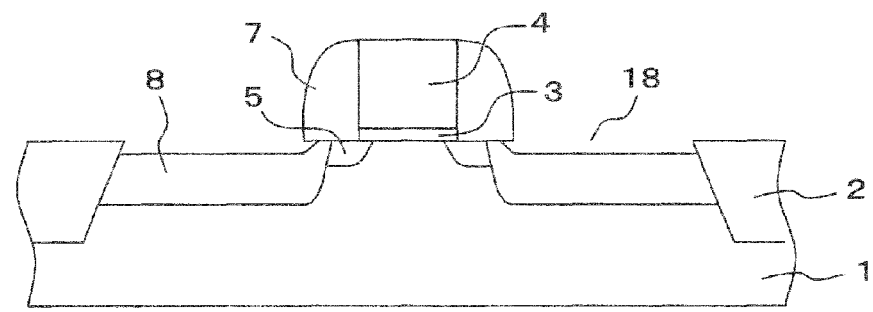

FIG. 10A (FIFTH EXEMPLARY EMBODIMENT)
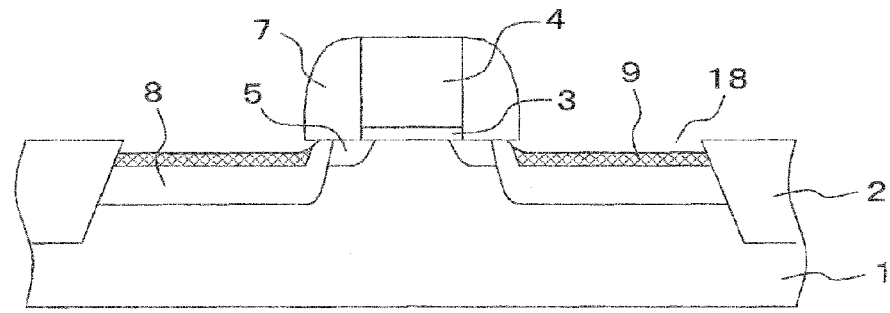
FIG. 10B (FIFTH EXEMPLARY EMBODIMENT)
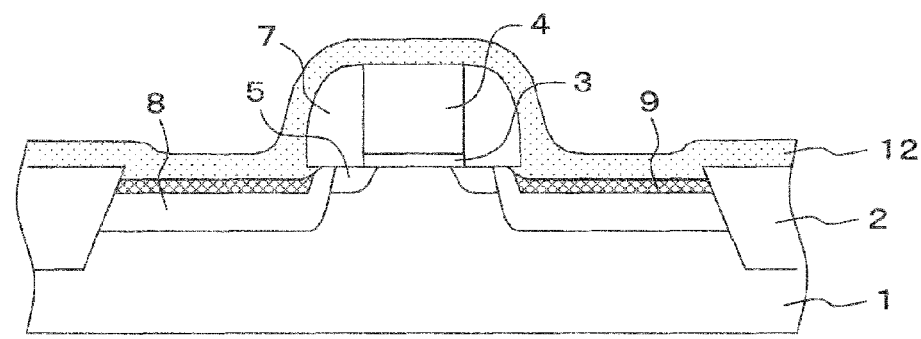
FIG. 10C (FIFTH EXEMPLARY EMBODIMENT)
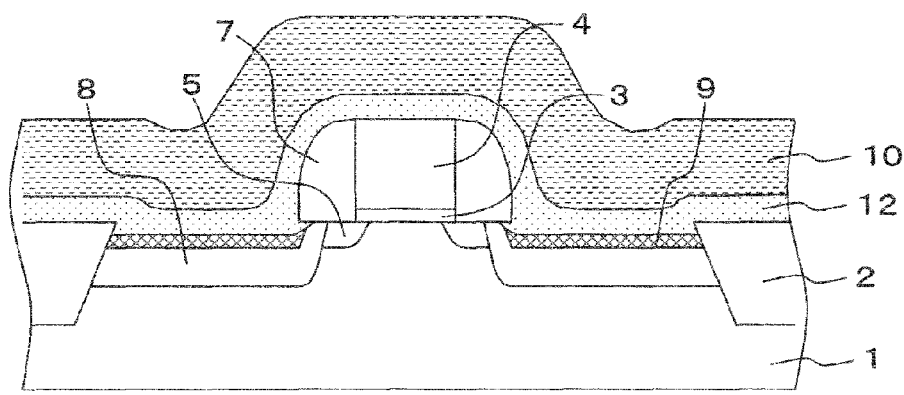

FIG. 11A (SIXTH EXEMPLARY EMBODIMENT)
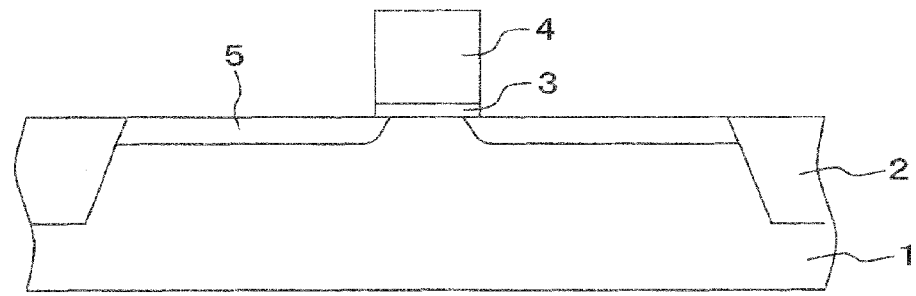
FIG. 11B (SIXTH EXEMPLARY EMBODIMENT)
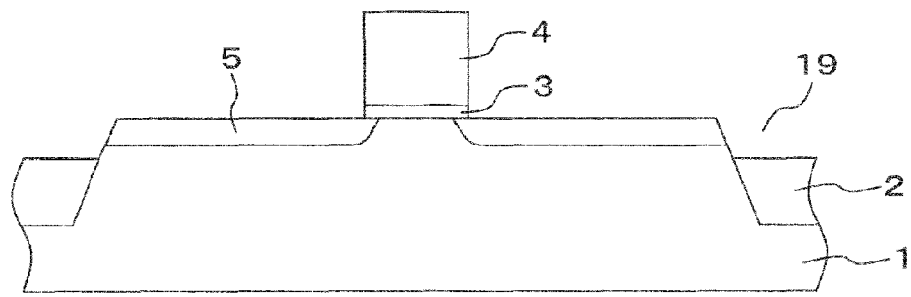
FIG. 11C (SIXTH EXEMPLARY EMBODIMENT)
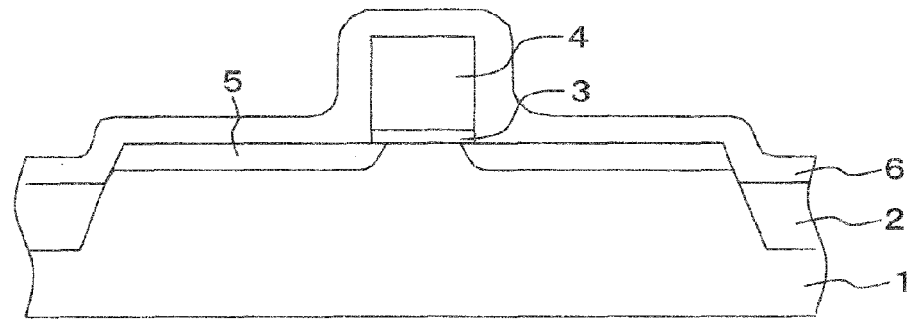

FIG. 12A (SIXTH EXEMPLARY EMBODIMENT)
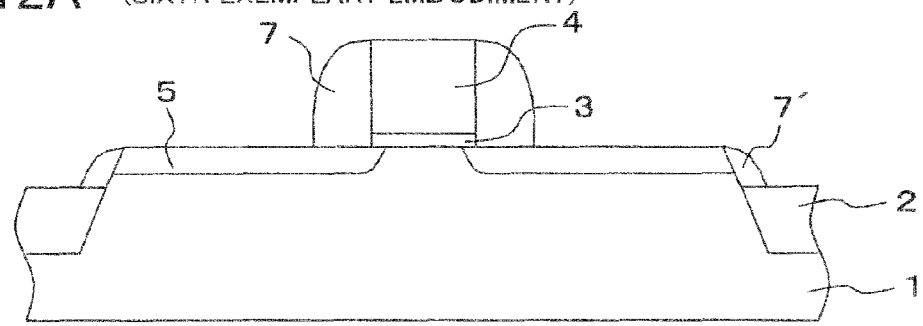
FIG. 12B (SIXTH EXEMPLARY EMBODIMENT)
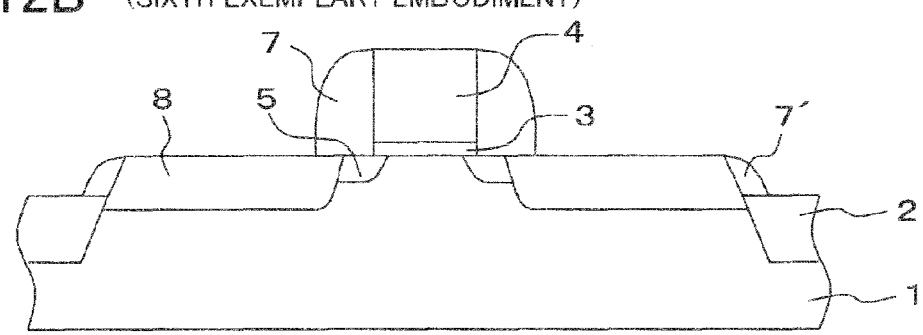
FIG. 12C (SIXTH EXEMPLARY EMBODIMENT)
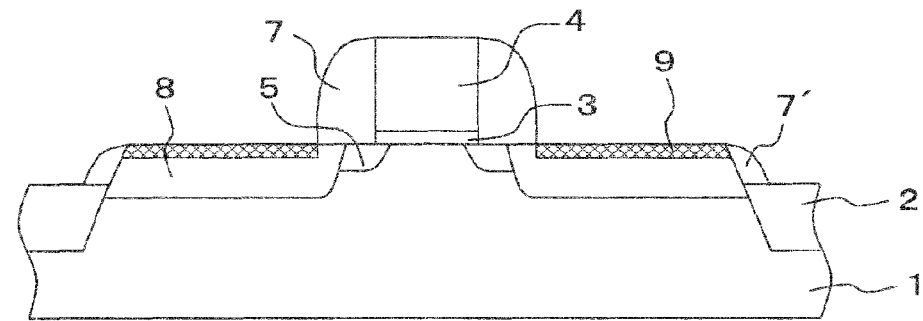

FIG. 13A (SIXTH EXEMPLARY EMBODIMENT)
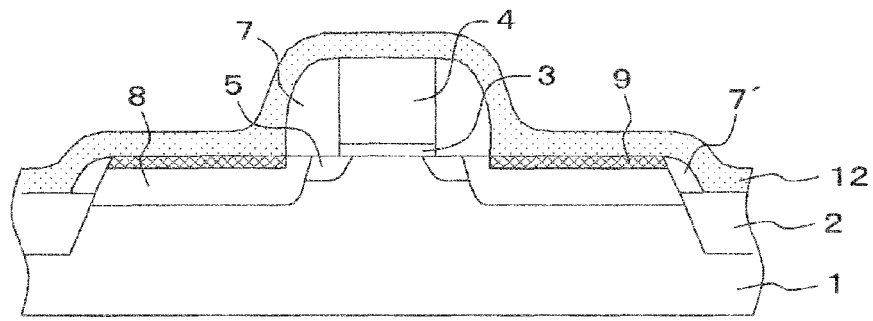
FIG. 13B (SIXTH EXEMPLARY EMBODIMENT)
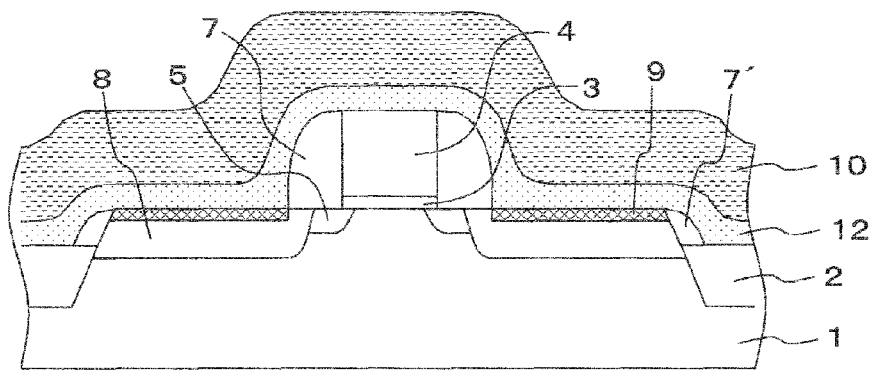

FIG. 14A (SEVENTH EXEMPLARY EMBODIMENT)
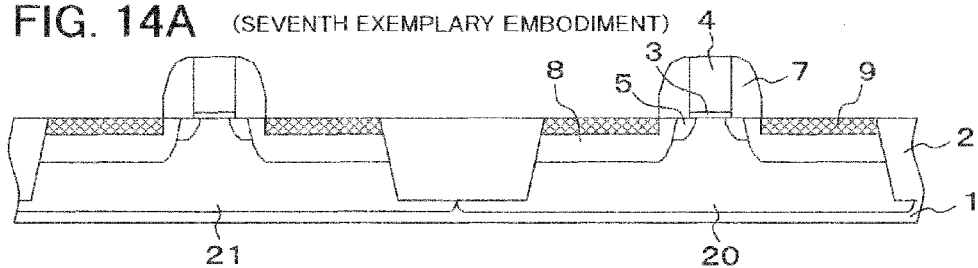
FIG. 14B (SEVENTH EXEMPLARY EMBODIMENT)
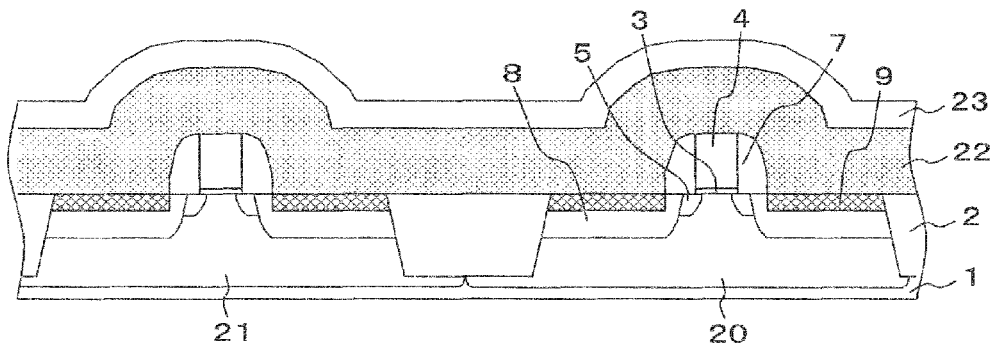
FIG. 14C (SEVENTH EXEMPLARY EMBODIMENT)
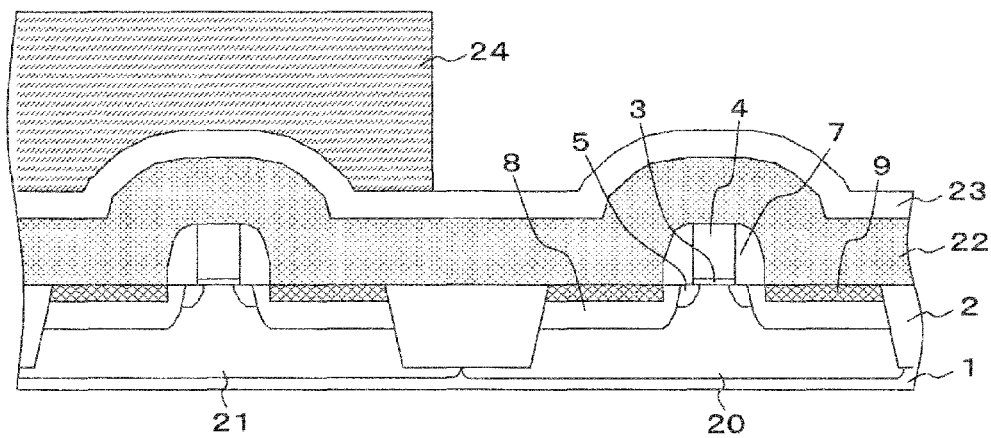

FIG. 15A (SEVENTH EXEMPLARY EMBODIMENT)
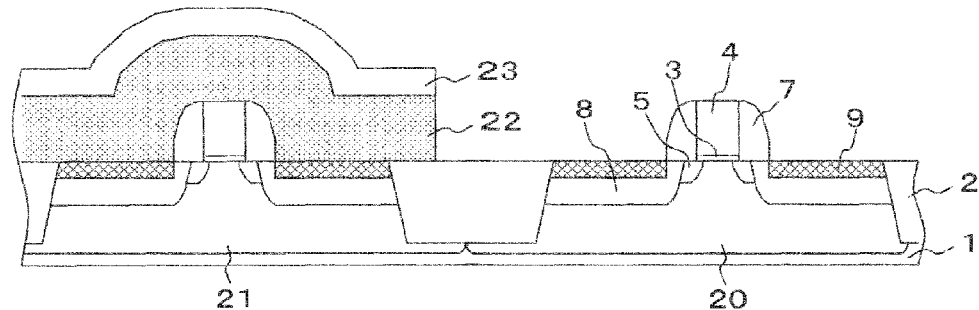
FIG. 15B (SEVENTH EXEMPLARY EMBODIMENT)
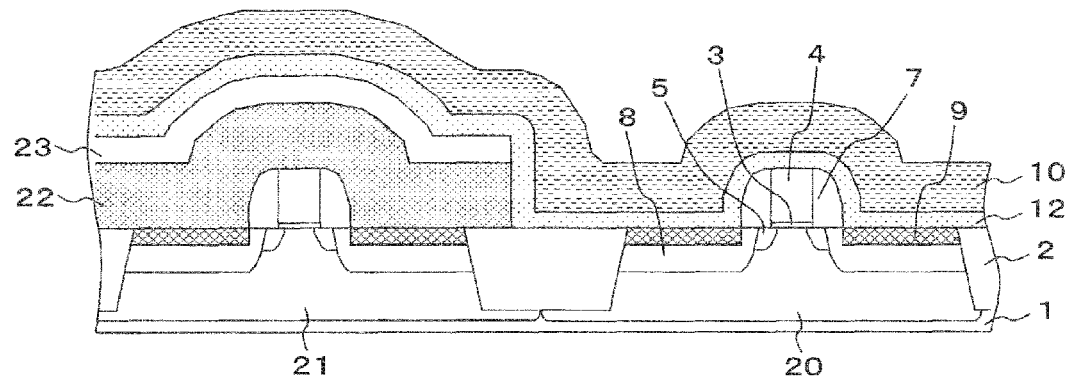
FIG. 15C (SEVENTH EXEMPLARY EMBODIMENT)
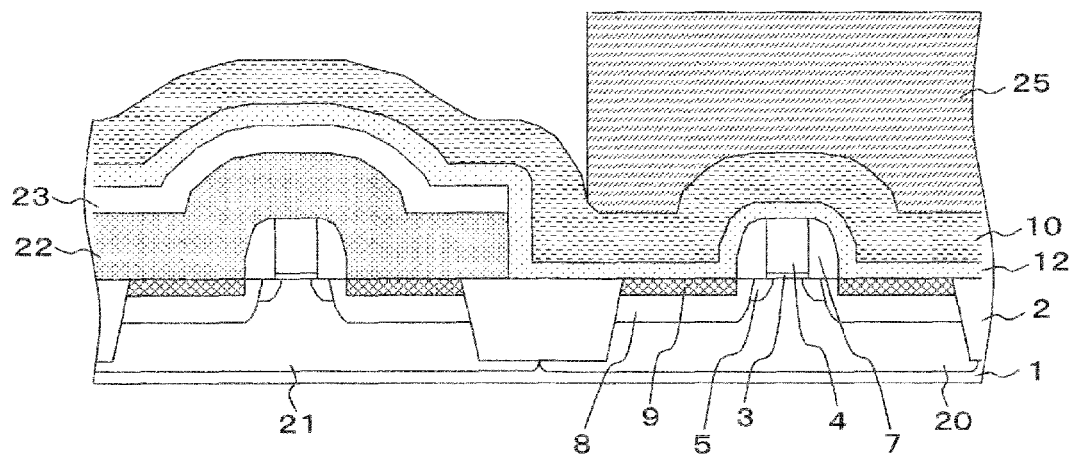

FIG. 16A (SEVENTH EXEMPLARY EMBODIMENT)
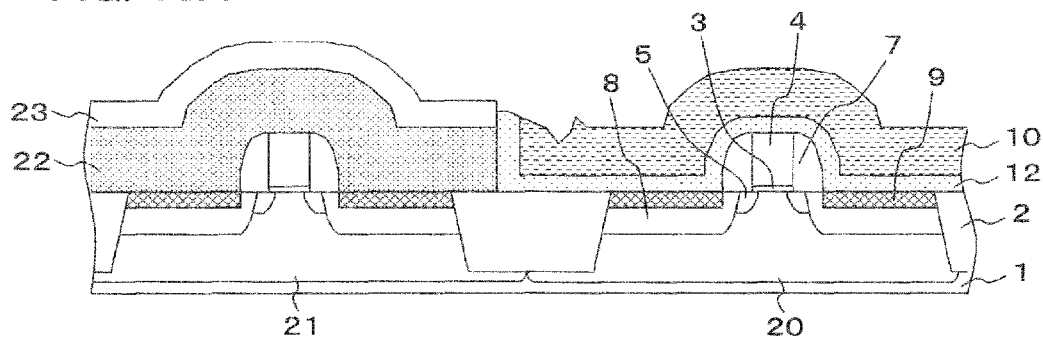
FIG. 16B (SEVENTH EXEMPLARY EMBODIMENT)
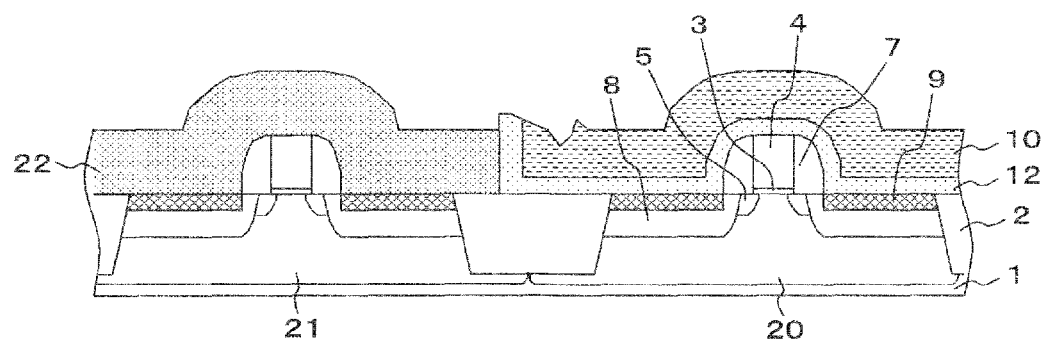

FIG. 17A (EIGHTH EXEMPLARY EMBODIMENT)
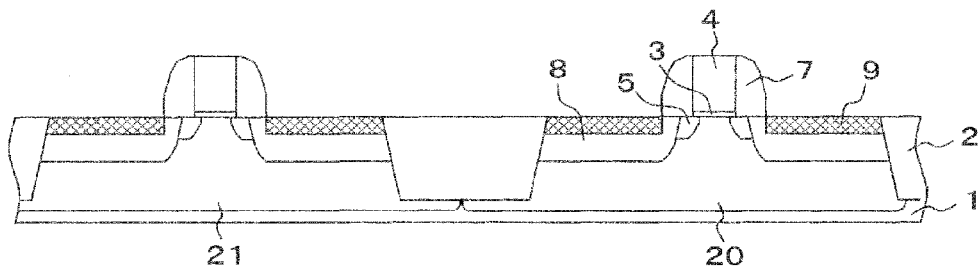
FIG. 17B (EIGHTH EXEMPLARY EMBODIMENT)
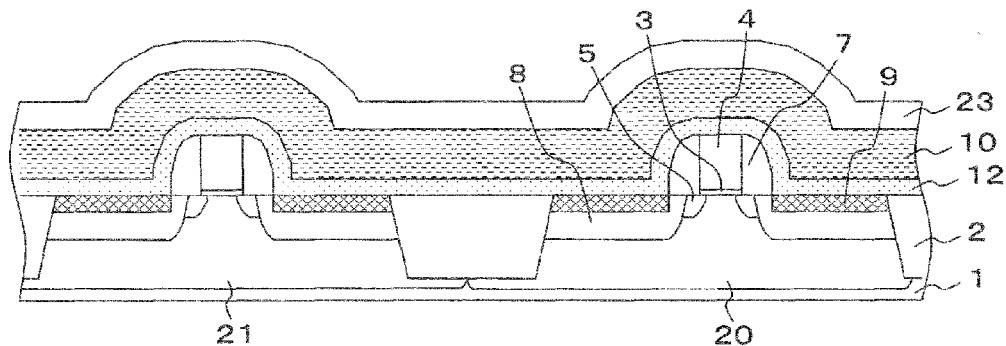
FIG. 17C (EIGHTH EXEMPLARY EMBODIMENT)
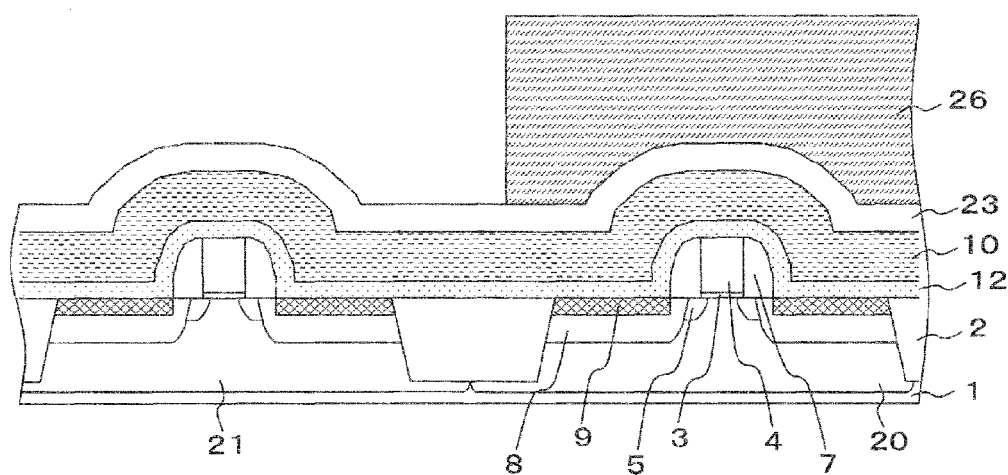

FIG. 18A (EIGHTH EXEMPLARY EMBODIMENT)
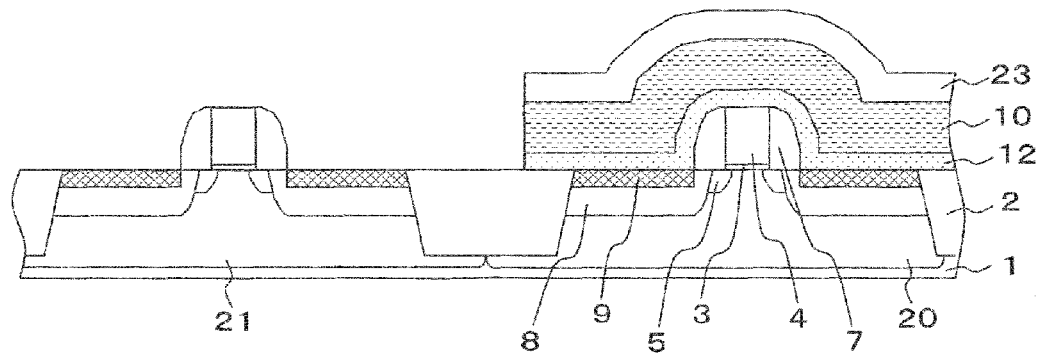
FIG. 18B (EIGHTH EXEMPLARY EMBODIMENT)
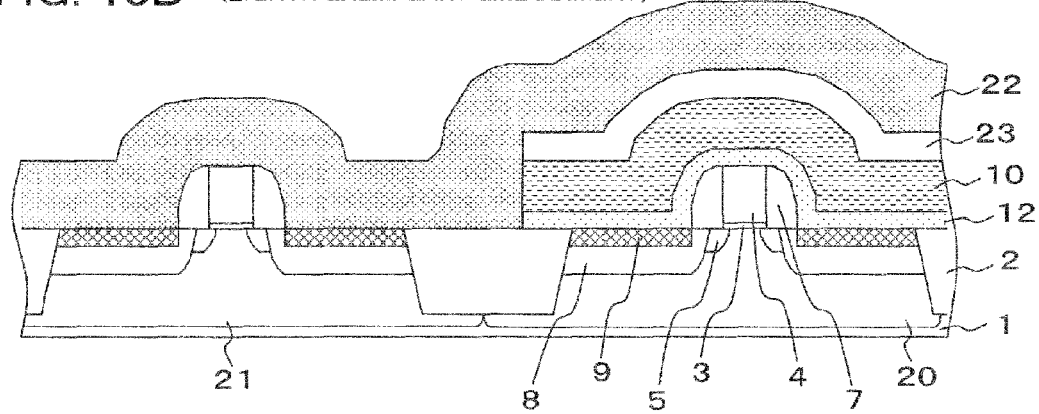
FIG. 18C (EIGHTH EXEMPLARY EMBODIMENT)
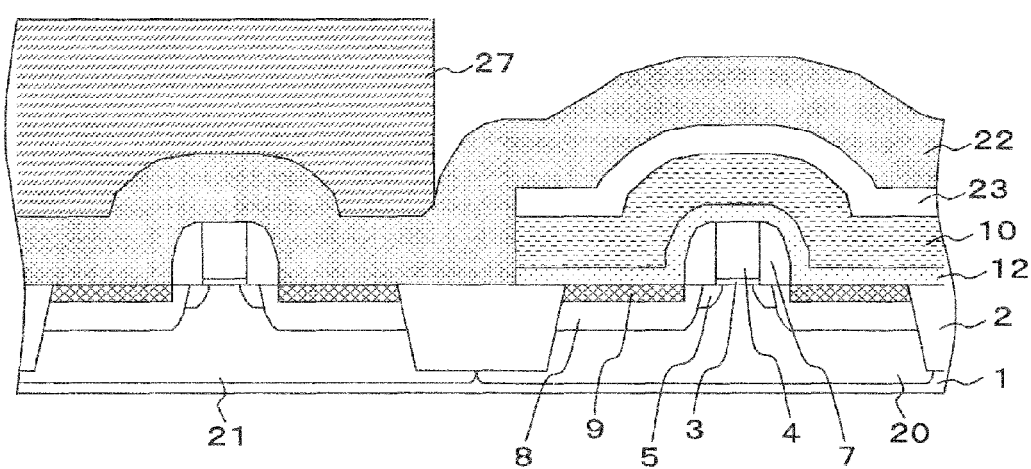

FIG. 19A (EIGHTH EXEMPLARY EMBODIMENT)
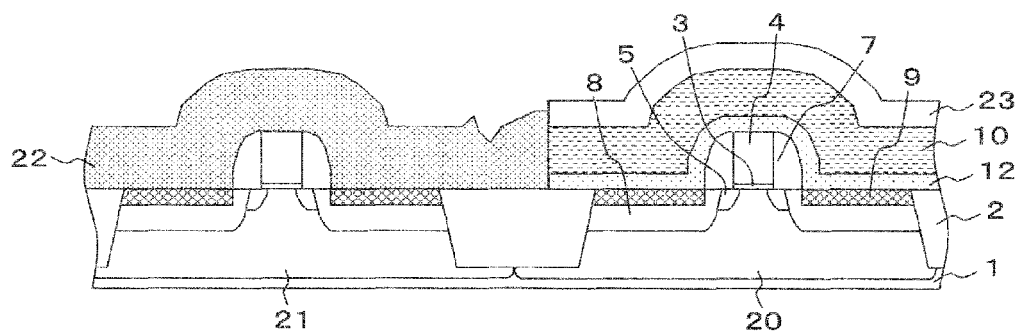
FIG. 19B (EIGHTH EXEMPLARY EMBODIMENT)
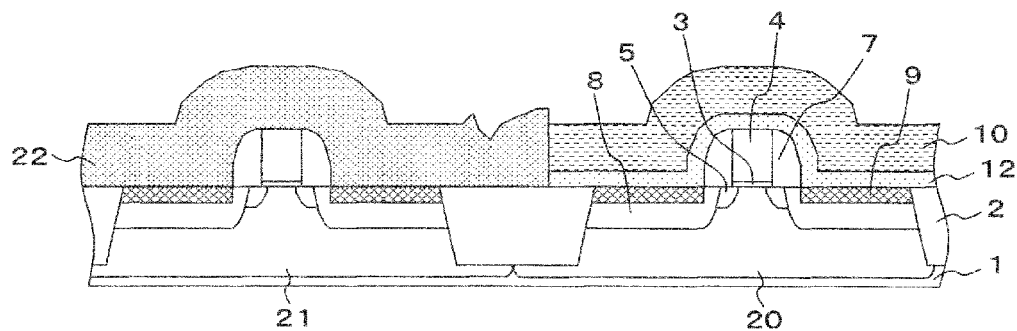

STRUCTURE A

STRUCTURE C

STRUCTURE B

STRUCTURE D

FIG. 21

RESULT OF CHECKERBOARD PATTERN TAPE TEST
(NUMBERS OF PEELED-OFF SAMPLES OUT OF 400 SAMPLES; EACH SAMPLE BEING 1 mm IN WIDTH)

| SAMPLE STRUCTURES | MAGNITUDES OF STRESS IN SILICON NITRIDE FILM SAMPLES SUBJECTED TO COMPRESSION STRESS | PRINCIPAL IMPURITIES IN UNDERLYING SILICON IN WHICH NICKEL SILICIDE HAS BEEN FORMED | | |
|---|---|---|---|---|
| | | BORON | PHOSPHORUS | BORON AND PHOSPHORUS |
| A | −2.2 GPa | — | ○ | △ |
| A | −2.7 GPa | ○ | △ | × |
| B (NITRIDE FILM OF LOW COMPRESSION STRESS; FILM THICKNESS BEING 5 nm) | −2.7 GPa | ○ | ○ | ○ |
| D (SILICON OXIDE FILM, FILM THICKNESS BEING 10 nm) | −2.7 GPa | ○ | ○ | ○ |
| D (SILICON OXIDE FILM, FILM THICKNESS BEING 5 nm) | −2.7 GPa | ○ | ○ | ○ |
| D (SILICON OXIDE FILM, FILM THICKNESS BEING 2.5 nm) | −2.7 GPa | △ | △ | × |

(○ DENOTES 0; △ DENOTES FROM 1 TO 150; × DENOTES FROM 151 TO 300; — DENOTES NO DATA)

FIG. 24A

SILICON NITRIDE FILM
OF HIGH COMPRESSION
STRESS ON COBALT
SILICIDE FORMED ON
ARSENIC-DOPED SILICON

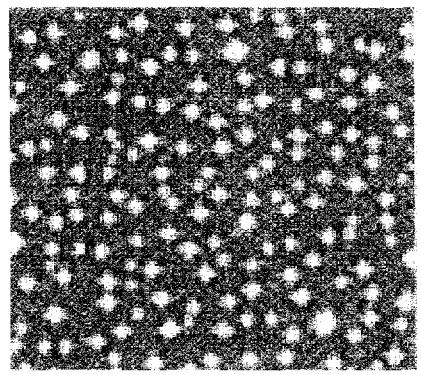

SILICON NITRIDE FILM
OF HIGH COMPRESSION
STRESS ON NICKEL
SILICIDE FORMED ON
ARSENIC-DOPED SILICON

SILICON NITRIDE FILMS
OF HIGH COMPRESSION
STRESS ON VARIOUS
DIFFERENT UNDERLYING
STRUCTURES

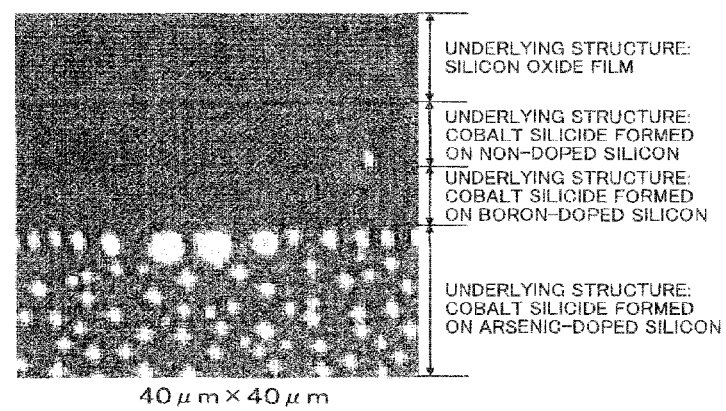

UNDERLYING STRUCTURE:
SILICON OXIDE FILM

UNDERLYING STRUCTURE:
COBALT SILICIDE FORMED
ON NON-DOPED SILICON

UNDERLYING STRUCTURE:
COBALT SILICIDE FORMED
ON BORON-DOPED SILICON

UNDERLYING STRUCTURE:
COBALT SILICIDE FORMED
ON ARSENIC-DOPED SILICON

40 μm × 40 μm

SEMICONDUCTOR DEVICE

CROSS REFERENCE TO RELATED APPLICATIONS

This application is a division of co-pending application Ser. No. 13/408,082 filed on Feb. 29, 2012, which is a division of Ser. No. 12/303,822 filed on Jan. 28, 2009, which is a National Stage of PCT/JP2007/061382 filed on Jun. 5, 2007, which claims foreign priority to Japanese application No. 2006-159779 filed on Jun. 8, 2006. The entire content of each of these applications is hereby expressly incorporated by reference.

TECHNICAL FIELD

Reference to Related Application

This application is based upon and claims the benefit of the priority of Japanese patent application No. 2006-159779, filed on Jun. 8, 2006, the disclosure of which is incorporated herein in its entirety by reference thereto.

This invention relates to a semiconductor device and, more particularly, to a semiconductor device including a MISFET the channel region of which is subject to compressive strain.

BACKGROUND ART

Recently, with development in the field of the information communication equipment, the processing ability required of the LSI is becoming higher, and correspondingly, the operating speed of transistors is increasing. Up to now, the device structure has to be miniaturized in order to cope with such increase in the operating speed of transistors. However, it is becoming difficult to reduce the gate length due to limitations imposed on the photolithographic technique, while it is becoming difficult to reduce the film thickness of the gate insulating film due to physical factors.

For this reason, there is a demand for techniques for achieving high performance of LSIs by routes other than device size miniaturization. Among such techniques, there is such a technique consisting in applying the stress to apply strain to the channel to improve the mobility (piezo-resistance effect). In a known manner, if a tensile (or compressive) stress is applied in a parallel (horizontal) direction to the channel to induce strain, the electron mobility is improved (or deteriorated), while the hole mobility is deteriorated (or improved). Several techniques for improving the performance of LSIs by taking advantage of this phenomenon have so far been disclosed (see for example Patent Documents 1 and 2).

In Patent Document 1, there is disclosed a technique in which a silicon nitride film is used as a stopper film at the time of opening a contact hole. This silicon nitride film is subjected to high tensile stress to induce strain to the channel to improve the electron mobility thereby improving the performance of the n-channel MISFET (abbreviated herein to nMISFET).

In Patent Document 2, there is disclosed a technique in which the nMISFET is covered with a silicon nitride film being under the tensile stress, and a p-channel MISFET (abbreviated herein to pMISFET) is covered with another silicon nitride film being under the compression stress, thereby to improve the mobility of both carriers to improve the performance of both the nMISFET and the pMISFET.

Patent Document 1: JP Patent Kokai Publication No. JP-P2002-198368A
Patent Document 2: JP Patent Kokai Publication No. JP-P2003-86708A
Non-Patent Document 1: "Journal Vacancy Science Technology (J. Vac. Sci. Technol.", US, 1998, A16(4), p 2003
Non-Patent Document 2: "Journal Vacancy Science Technology (J. Vac. Sci. Technol." US, 1999, A17(5), p 2612

DISCLOSURE OF THE INVENTION

Problems to be Solved by the Invention

However, if the silicon nitride film being under a high compression stress is directly used as a stress film, problems fatal to LSI manufacture are raised. In addition, it is difficult in such case to apply a high stress to the channel. The reason is explained as follows:

FIG. 24 shows a plan image, as observed over an optical microscope, of a silicon nitride film of high compression stress as deposited on a metal silicide film. Tests conducted by the present inventors have revealed that, when a silicon nitride film of high compression stress is deposited on a metal silicide film, formed on arsenic-doped silicon, numerous bubbles, looking like white nebulae or stars, are formed (see fourth column from above of FIGS. 24A, 24B and 24C). These bubbles, though small in number, were similarly observed in a case where a metal silicide film of a high compression stress, is deposited on a metal silicide film formed on a non-doped silicon substrate or on boron-doped silicon (see second and third layers from above of FIG. 24C). It should be noted that such phenomenon was not noticed with a silicon nitride film under the tensile stress or a silicon nitride film of a low stress.

FIG. 25 shows an image of a cross-section of a bubble part of a silicon nitride film as observed with a SEM. It has been confirmed that the bubble part is a partially peel-off portion of an interface between a metal silicide film and a silicon nitride film that is subjected to a high compression stress.

According to the founding, as obtained by the present inventors, this phenomenon may be accounted for as follows: A silicon nitride film, subjected to high compression stress, is increased in its volume by peeling off from the metal silicide film, and attempts to release its stress. On the other hand, a silicon nitride film, subjected to the tensile stress, or a silicon nitride film of a low stress, is immune from this peeling-off brought forth by the stress. The bubble part of the silicon nitride film may cause peeling-off of the entire film in the course of the CMP (chemical mechanical polishing) step among the steps of the LSI manufacturing process.

If the silicon nitride film is peeled off not only, the entire lot of such film is discarded, but, to make the matters worse, the peeled-off film may be turned into dust to lower the yield of other lots. Even though the film is not completely peeled-off, partial peeling-off of the film (bubble part) tends to lower the stress applied to the channel, offering a fear to deteriorate characteristics of MISFETs.

The problems about manufacturing pMISFET by using a nitride film, subjected to a high compressive stress, are now described with reference to the drawings. FIGS. 26A to 26C and FIGS. 27A to 27C are cross-sectional views schematically showing the process steps for manufacturing a semiconductor device according to a conventional technique. Initially, a device isolation 102 is formed on a silicon substrate 101. A gate insulating film and a gate electrode film are then deposited, after which a gate insulating film 103 and a gate electrode 104 are formed by patterning. Then, using the gate electrode 104 as a mask, boron ions are implanted into the silicon substrate 101 to form a source/drain extension [sic. diffusion] region 105 (see FIG. 26A). After that, a silicon oxide film 106 is deposited thereon by a CVD method (see FIG. 26B) and etched back. As a result, gate sidewall spacers 107 are formed (FIG. 26C). Then, using the gate electrode 104 and the gate sidewall spacer 107 as a mask, boron ions are implanted in the source/drain extension [sic. diffusion] region 105 and activated by heat treatment to form a source/drain 108 (FIG. 27A). A silicidation reaction is then produced on an upper surface of a source/drain 108 by nickel sputtering and heat treatment. As a result, nickel silicide layer 109 is formed (FIG. 27B). Excess nickel is removed by, for example, wet etching. A silicon nitride film 110 with high compressive stress is then deposited on the pMISFET (see FIG. 27C).

However, since the nickel silicide 109 is poor in tight adhering property with respect to the silicon nitride film 110 subjected to high compression stress, such that a partially peeled-off portion 111 tends to be produced. Thus, the stress applied to the channel is not sufficient and hence a sufficient pMOSFET performance cannot be achieved. Furthermore, there are even cases where the silicon nitride film 110, subjected to high compression stress, is peeled off over a wide area in the course of subsequent process steps, such that LSI manufacture may not be brought to completion.

It is a principal object of the present invention to improve the tight adhering property of a silicon nitride film, subjected to a high compression stress, relative to its underlying structure, such as to enable a high stress to be applied to the channel, to make hard to peel of, and thereby to improve characteristics of a MISFET.

In a first aspect, the present invention provides a semiconductor device including a MISFET, in which the semiconductor device comprises a first film that covers at least a portion of an upper part of a source/drain of the MISFET, and a second film arranged on the first film. The first film is of a film thickness thinner than a height of a gate electrode. The second film is a stressed film including a stress. A tight adhering property between the first film and the surface of the source/drain and a tight adhering property between the first film and the second film are rendered higher than a tight adhering property between the second film and the source/drain which would prevail when the second film and the source/drain be made to adhere tightly together.

In a second aspect, the present invention provides a semiconductor device including a MISFET, in which the semiconductor device comprises a first film that covers at least a portion of an upper part of a source/drain of the MISFET and a second film arranged on the first film. The first film is of a film thickness thinner than the height of a gate electrode. The first and second films are films subjected to compressive stress. The compressive stress of the first film is lower than the compressive stress of the second film.

In a third aspect, the present invention provides a semiconductor device including a MISFET, in which the semiconductor device comprises a first film that covers at least a portion of an upper part of a source/drain of the MISFET and a second film arranged on the first film. The first film is of a film thickness thinner than the height of a gate electrode. The first film is free of stress, while the second film is a film subjected to compressive stress.

In a fourth aspect, the present invention provides a semiconductor device including a MISFET, in which the semiconductor device comprises a first film that covers at least a portion of an upper part of a source/drain of the MISFET and a second film arranged on the first film. The first film is of a film thickness thinner than the height of a gate electrode. The first film and the second film are silicon nitride films. The first film has a nitrogen concentration higher than that of the second film.

In a fifth aspect, the present invention provides a semiconductor device including a MISFET, in which the semiconductor device comprises a first film that covers at least a portion of an upper part of a source/drain of the MISFET and a second film arranged on the first film. The first film is of a film thickness thinner than the height of a gate electrode. The first film and the second film are hydrogen-containing silicon nitride films. The first film has a ratio of a concentration of silicon-hydrogen bond to a concentration of nitrogen-hydrogen bond higher than that of the second film.

Meritorious Effects of the Invention

According to the present invention, in which the tight adhering property of the silicon nitride film of high compression stress with respect to the underlying structure may be improved, peel-off of the silicon nitride film in its entirety during the LSI manufacturing process may be inhibited to obviate the problems of lot discarding or the lowered line yield. Furthermore, the stress applied to the channel may be increased, resulting in improved MISFET characteristics.

BRIEF DESCRIPTION OF THE DRAWINGS

FIGS. 1A to 1C are cross-sectional views schematically showing process steps of a method for manufacturing a semiconductor device according to a first exemplary embodiment of the present invention.

FIGS. 2A to 2C are cross-sectional views schematically showing process steps of a method for manufacturing a semiconductor device according to a second exemplary embodiment of the present invention.

FIG. 3 is a bar graph showing values of the stress applied on the channel by an upper part of a gate electrode, a lateral side part of the gate electrode and an upper source/drain part of the silicon nitride film subjected to a high compression stress.

FIGS. 4A to 4D are cross-sectional views schematically showing process steps of a method for manufacturing a semiconductor device according to a third exemplary embodiment of the present invention.

FIG. 5 is a graph showing the results of simulation for the width of the gate sidewall and the magnitude of the channel stress by calculations.

FIGS. 6A to 6C are cross-sectional views schematically showing a first process step of a method for manufacturing a semiconductor device according to a fourth exemplary embodiment of the present invention.

FIGS. 7A to 7C are cross-sectional views schematically showing a second process step of the method for manufacturing the semiconductor device according to the fourth exemplary embodiment of the present invention.

FIGS. 8A and 8B are cross-sectional views schematically showing a third process step of the method for manufacturing the semiconductor device according to the fourth exemplary embodiment of the present invention.

FIGS. 9A to 9C are cross-sectional views schematically showing a first process step of a method for manufacturing a semiconductor device according to a fifth exemplary embodiment of the present invention.

FIGS. 10A to 10C are cross-sectional views schematically showing a second process step of the method for manufacturing the semiconductor device according to the fifth exemplary embodiment of the present invention.

FIGS. 11A to 11C are cross-sectional views schematically showing a first process step of a method for manufacturing a semiconductor device according to a sixth exemplary embodiment of the present invention.

FIGS. 12A to 12C are cross-sectional views schematically showing a second process step of the method for manufacturing the semiconductor device according to the sixth exemplary embodiment of the present invention.

FIGS. 13A and 13B are cross-sectional views schematically showing a third process step of the method for manufacturing the semiconductor device according to the sixth exemplary embodiment of the present invention.

FIGS. 14A to 14C are cross-sectional views schematically showing a first process step of a method for manufacturing a semiconductor device according to a seventh exemplary embodiment of the present invention.

FIGS. 15A to 15C are cross-sectional views schematically showing a second process step of the method for manufacturing the semiconductor device according to the seventh exemplary embodiment of the present invention.

FIGS. 16A and 16B are cross-sectional views schematically showing a third process step of the method for manufacturing the semiconductor device according to the seventh exemplary embodiment of the present invention.

FIGS. 17A to 17C are cross-sectional views schematically showing a first process steps of a method for manufacturing a semiconductor device according to an eighth exemplary embodiment of the present invention.

FIGS. 18A to 18C are cross-sectional views schematically showing a second process step of the method for manufacturing the semiconductor device according to the eighth exemplary embodiment of the present invention.

FIGS. 19A and 19B are cross-sectional views schematically showing a third process step of the method for manufacturing the semiconductor device according to the eighth exemplary embodiment of the present invention.

FIG. 21 shows, in a tabulated form, the results of a checkerboard pattern tape test of a silicon nitride film of high compression stress on metal silicide.

FIGS. 24A to 24C show plan images as observed by an optical microscope of a silicon nitride film of high compression stress as deposited on a metal silicide film.

Figure 20A:
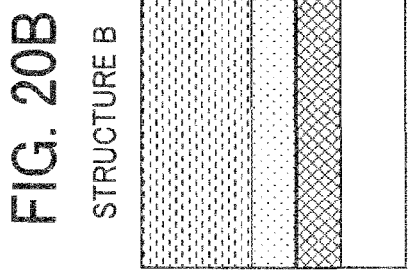
FIGS. 20A to 20D are partial cross-sectional views schematically showing the structures of samples of Examples of the present invention and Comparative Examples.
Figure 20C:
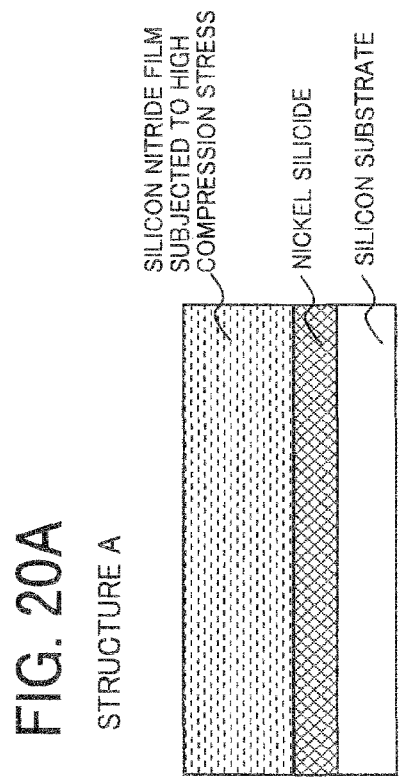
Figure 20B:
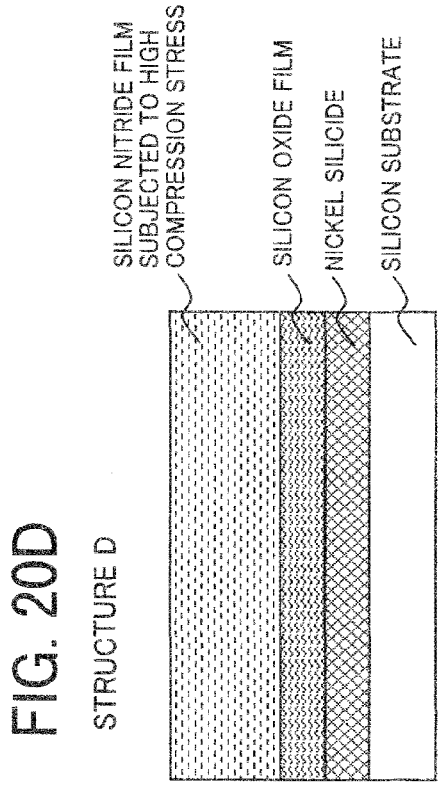
Figure 20D:
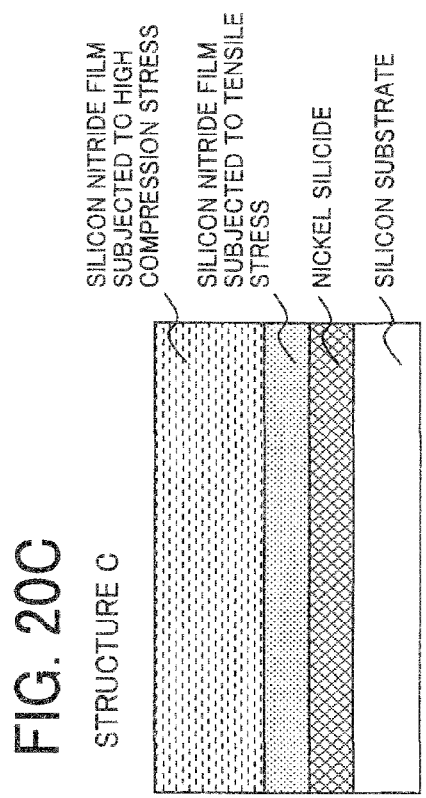

EXPLANATION OF SYMBOLS 1, 101 silicon substrate
2, 102 device isolation region
3, 103 gate insulating film
4, 104 gate electrode
5, 105 source/drain extension region
6, 106 silicon oxide film
7, 107 gate sidewall
7' diffusion layer sidewall
8, 108 source/drain
9, 109 nickel silicide
10, 110 silicon nitride film subjected to high compression stress
12 silicon nitride film subjected to low compression stress
13 small gate sidewall
14 silicon oxide film
15 silicon nitride film
16 gate sidewall
17 gate sidewall
18 recess
19 recess
20 N-well
21 P-well
22 silicon nitride film subjected to tensile stress
23 silicon oxide film
24, 25, 26, 27, 28 photoresist films
111 partially peeled-off portion

PREFERRED MODES FOR CARRYING OUT THE INVENTION

In the first aspect, the stress of the second film is preferably the compression stress.

In the first to third aspects, the second film is preferably a silicon nitride film.

In the first to third aspects, the second film may contain hydrogen.

The first film is preferably a silicon nitride film.

The first film may contain hydrogen.

The first film may be a silicon oxide film.

In the first to fifth aspects, the first film is preferably of a thickness not less than 5 nm.

In the respective aspects, the first film is preferably of a thickness not less than 10 nm.

In the respective aspects, the MISFET is preferably a p-channel MISFET.

In the respective aspects, a metal silicide film is preferably formed at an interface between the first film and the source/drain.

In the respective aspects, the first and second films are preferably removed at least at an upper part of the gate electrode.

In the respective aspects, gate sidewalls lower in height than the gate electrode are preferably formed on both sides of the gate electrode.

In the respective aspects, gate sidewalls having a cross-section in the form of an uppercase letter L are preferably formed on both sides of the gate electrode.

In the respective aspects, the source/drain is preferably sunk to a lower level (depth) than the gate insulating film lying below the gate electrode.

In the respective aspects, there are provided a device isolation region and a diffusion layer sidewall. The device isolation region is formed around the source/drain and etched to a level (depth) lower than the upper surface of the source/drain. The diffusion layer sidewall is formed on the lateral side of the source/drain.

First Exemplary Embodiment

A semiconductor device according to a first exemplary embodiment of the present invention is now described with reference to the drawings. FIGS. 1A to 1C depict cross-sectional views schematically showing a method for manufacturing a semiconductor device according to the first exemplary embodiment of the present invention. It should be noted that the term source/drain as used in the present description means a region inclusive of a metal silicide part on the source/drain as well.

Referring to FIG. 1C, the present semiconductor device includes a device isolation region 2 which is formed by embedding an insulating material in a groove defined between neighboring device forming regions on a silicon substrate 1. A MISFET is to be formed in each of the device forming regions. In each of the device forming regions, a gate electrode 4 is formed on top of a channel via a gate insulating film 3. A gate sidewall 7, formed by a silicon oxide film, is formed to define the sidewall of the gate electrode 4. A source/drain extension region 5 is formed below the gate sidewall 7 on both sides of the channel by injecting boron ions by ion implantation into the silicon substrate 1. On an outer side of the source/drain extension region 5, there is formed a source/drain 8 by injecting boron ions into the silicon substrate 1 to a site (or level) deeper than the source/drain extension region 5. Nickel silicide 9 is formed on the surface of the source/drain 8 in a region defined between the gate sidewall 7 and the device isolation region 2. On the surface part of the substrate, including the device isolation region 2, nickel silicide 9, gate sidewall 7 and the gate electrode 4, there is formed a silicon nitride film 12 thinner in thickness than the height of the gate electrode 4 and which is subjected to compression stress lower (weaker) than that of a silicon nitride film 10. The compression stress of the silicon nitride film 12 is preferably lower than −2.2 GPa. The silicon nitride film 10, formed on the surface of the silicon nitride film 12, is a stressed film (a film subjected to a compression stress) higher (stronger) than that of the silicon nitride film 12.

The method for preparation of the semiconductor device of the first exemplary embodiment is now described.

Initially, the device isolation region 2 is formed on the N-type silicon substrate 1 by a method similar to the method of the conventional technique (see FIGS. 26A to 26C and 27A). A gate insulating film and a gate electrode layer are then deposited, after which a gate insulating film 3 and a gate electrode 4 are formed by patterning. The source/drain extension region 5 is then formed by injecting boron ions by ion implantation, using the gate electrode 4 as a mask. A silicon oxide film for forming the gate sidewall 7 is then caused to grow on the entire substrate surface by the CVD method. The gate sidewall 7 is then formed by etchback. Then, using the gate electrode 4 and the gate sidewall 7 as a mask, boron ions are injected into the source/drain region by ion implantation. The source/drain 8 then is formed by boron activation by heat treatment. Nickel sputtering and heat treatment are then carried out to produce a siliciding reaction on the upper surface of the source/drain 8 to form nickel silicide 9 (see FIG. 1A). Excess nickel is removed by e.g., wet etching.

The silicon nitride film 12, thinner in thickness than the height of the gate electrode 4 and which is subjected to low compression stress, is then formed as a tight adhering layer (see FIG. 1B). The silicon nitride film 10, subjected to high compression stress, is then formed on the pMISFET (see FIG. 1C). Contact plugs and writing (interconnect) layers etc., are then formed.

The silicon nitride film 10 and the silicon nitride film 12 are now described. It is noted that the compositional proportions of silicon and nitrogen and the content of hydrogen as well as the state of hydrogen linkages influence the stress of the silicon nitride film. According to Non-Patent Document 1, the compression stress decreases with increase in the proportion of nitrogen in the silicon nitride film. According to Non-Patent Document 2, the compression stress decreases with increase in a ratio (number of N—H linkages)÷(number of Si—H linkages) in the silicon nitride film.

Hence, to form the silicon nitride film 12 with a low compression stress, it is only sufficient to increase the proportion of nitrogen or to increase the ratio ((number of N—H linkages)÷(number of Si—H linkages)) in the film. Meanwhile, a silicon oxide layer may be used in place of the silicon nitride film 12 as a tight adhering layer. In this case, a film thickness of the silicon oxide layer not less than 5 nm is more effective. The film thickness not less than 10 nm is desirable for increasing the on-current.

Although the presence of the tight adhering layer may be confirmed by elementary analysis along the depth-wise direction, such as SIMS, the presence of the layer may more simply be observed by using the differential wet etch rate of the tight adhering layer and the nitride film subjected to the compression stress with respect to an etching solution. According to Non-Patent Document 1 the wet etch rate relative to buffered hydrofluoric acid increases with decrease in the compression stress of the silicon nitride film. The presence of the tight adhering layer may thus be confirmed by wet etching the cross-sectional surface of a sample of the pMISFET of the first exemplary embodiment with buffered hydrofluoric acid and observing the resulting surface with SEM.

With the first exemplary embodiment, tight adhering property is improved due to the presence of the silicon nitride film 12, as the tight adhering layer, below the silicon nitride film 10 of high compression stress. The result is that the film in its entirety is hardly liable to peel off in the course of the LSI manufacturing process. The problem of lot discarding or decrease in yield is not presented such that LSIs manufacturing can be completed satisfactorily. Also, the stress is sufficiently applied to the channel, thus achieving a high pMISFET performance.

Second Exemplary Embodiment

A method for manufacturing a semiconductor device according to a second exemplary embodiment is now described. FIGS. 2A to 2C depict schematic cross-sectional views for illustrating a process for manufacturing a semiconductor device according to the second exemplary embodiment.

The semiconductor device according to the second exemplary embodiment corresponds to the semiconductor device of the first exemplary embodiment devoid of the silicon nitride film 10 of high compression stress and the silicon nitride film 12 of low compression stress which are formed on top of the gate electrode (4 of FIG. 1) (see FIG. 2C). The formulation of the second exemplary embodiment is otherwise the same as that of the first exemplary embodiment.

The method for manufacturing the semiconductor device of the second exemplary embodiment is now described.

A semiconductor device similar to the semiconductor device of the first exemplary embodiment is manufactured by a method similar to the method of the first exemplary embodiment (see FIG. 2A). A photoresist film 28 then is coated on the surface of the silicon nitride film 10 and, using a photolithographic technique, the portion of the photoresist film 28 overlying the gate electrode 4 is removed (see FIG. 2B). The silicon nitride film 10 of high compression stress and the silicon nitride film 12 of low compression stress are removed by anisotropic dry etching, using the photoresist film 28 as a mask (see FIG. 2C). The photoresist film 28 is also removed subsequently. Contact plugs, interconnect (wiring) layers and so forth are then formed.

With the second exemplary embodiment, in which the silicon nitride film 12, operating as the tight adhering layer, is provided below the silicon nitride film 10 of high compression stress, the tight adhering property is improved, and hence the film peel-off is hardly produced. Thus, not only LSI manufacture may be completed satisfactorily, but also the stress may sufficiently be applied to the channel, thus achieving the high pMISFET performance.

Moreover, since the portion of the silicon nitride film of high compression stress, overlying the gate electrode, is now removed, the channel stress becomes correspondingly higher than with the structure of the first exemplary embodiment. The underlying principle is now explained.

FIG. 3 shows values of the stress applied to the channel from different portions of the silicon nitride film (10 of FIG. 2) subjected to high compression stress. These portions are those in register with the upper part of the gate electrode (4 of FIG. 2), the lateral side of the gate electrode (4 of FIG. 2) and with the upper part of the source/drain (8 of FIG. 2). The silicon nitride film portion in register with the upper part of the gate electrode rather acts for lowering the channel stress. Thus, the channel stress becomes correspondingly higher, if this silicon nitride film portion overlying the gate electrode is removed.

Third Exemplary Embodiment

The semiconductor device according to the third exemplary embodiment of the present invention is now described with reference to the drawings. FIG. 4 depicts a schematic cross-sectional view for illustrating the process for manufacturing the semiconductor device according to the third exemplary embodiment of the present invention.

With the semiconductor device of the third exemplary embodiment, the gate sidewall (7 of FIG. 1) in the semiconductor device of the first exemplary embodiment is formed so as to be a small gate sidewall 13 (lower in height than the gate electrode 4) (see FIG. 4D). The present exemplary embodiment is otherwise similar in its formulation to the first exemplary embodiment.

The method for manufacturing the semiconductor device of the present third exemplary embodiment is now described.

Initially, a device separation region 2 is formed in an N-type silicon substrate 1, by a method similar to that of the conventional technique (see FIGS. 26A to C and 27A). A gate insulating film and a gate electrode film are then deposited. A gate insulating film 3 and a gate electrode 4 are then formed by patterning. Then, using the gate electrode 4 as the mask, boron ions are injected by ion implantation to form a source/drain extension region 5. A silicon oxide film for a gate sidewall 7 is then caused to grow by CVD on the entire substrate surface. The gate sidewall 7 is then formed by etchback. Then, using the gate electrode 4 and the gate sidewall 7 as a mask, boron ions are injected by ion implantation into the source/drain region. Heat treatment is then carried out for boron activation for forming the source/drain 8. Nickel sputtering and heat treatment are then carried out to produce a siliciding reaction on the upper surface of the source/drain 8 to form nickel silicide 9 (see FIG. 4A). Excess nickel is removed by e.g., wet etching.

The gate sidewall 7 is then etched by isotropic dry-etching to form a small gate sidewall 13 (see FIG. 4B). In this case, the gate sidewall 7 may be removed completely. If a common contact technique is used, the gate sidewall is preferably left. However, if the common contact technique is not used, the gate sidewall need not necessarily be left.

A silicon nitride film 12 is then formed as a tight adhering layer (FIG. 4C). This silicon nitride film has a film thickness thinner than the height of the gate electrode, and is subjected to a low compression stress. A gate oxide film may also be used, as a tight adhering layer, in place of the silicon nitride layer 12. In the latter case, a film thickness of the silicon oxide film in excess of 5 nm is more effective. Preferably, the film thickness is 10 nm or larger for increasing the on-current.

A silicon nitride film 10, having a high compression stress, is then formed on the p-MISFET (see FIG. 4D). Contact plugs or interconnect layers are then formed.

With the third exemplary embodiment, tight adhering property may be improved due to the tight adhering layer underlying the silicon nitride film 10 subjected to the high compression stress, so that film peel-off is hardly produced. This not only enables LSI manufacture to be completed satisfactorily, but also enables a sufficient stress to be applied to the channel, thus achieving the high pMISFET performance.

Since the gate sidewall has become smaller in size, the distance between the silicon nitride film 10 subjected to the high compression stress and the channel is correspondingly reduced, with a result that the channel stress becomes higher than with the structure of the first exemplary embodiment. The underlying principle is now explained.

FIG. 5 depicts a graph showing the results of simulation of the relationship between the width of the gate sidewall and the magnitude of the channel stress by calculations. It is seen from FIG. 5 that, by reducing the width of the gate sidewall from 60 nm to 30 nm, the channel stress increases by 77%.

Fourth Exemplary Embodiment

The semiconductor device according to a fourth exemplary embodiment of the present invention is now described with reference to the drawings. FIGS. 6 to 8 depict schematic cross-sectional views for illustrating the process for manufacturing the semiconductor device according to the fourth exemplary embodiment of the present invention.

With the semiconductor device of the fourth exemplary embodiment, the gate sidewall 7 of the semiconductor device of the first exemplary embodiment is now formed so as to be a gate sidewall 16 of a thin thickness (with the cross-section in the form of an uppercase letter L) (see FIG. 8B). The formulation of the fourth exemplary embodiment is otherwise the same as that of the first exemplary embodiment.

The method for manufacturing the semiconductor device of the fourth exemplary embodiment is now described.

Figure 26A:
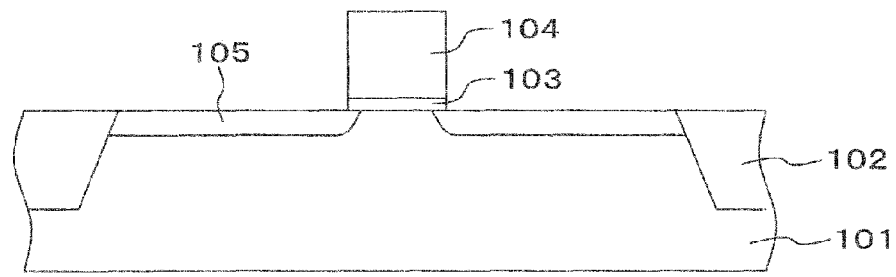
FIGS. 26A to 26C are cross-sectional views showing a first step schematically showing a method for manufacturing a semiconductor device according to a conventional technique.

Initially, a device isolation region 2 is formed in an N-type substrate 1 by a method similar to that of the conventional technique (refer to FIG. 26A). A gate insulating film and a gate electrode film are then deposited. A gate insulating film 3 and a gate electrode 4 are then formed by patterning. Boron ions are then injected by ion implantation, using the gate electrode 4 as a mask, to form a source/drain extension region 5 (see FIG. 6A).

A silicon oxide film 14 and a silicon nitride film 15 are then formed in this order by the CVD method on the entire substrate surface (FIG. 6B). Then, gate sidewalls 16, 17 are formed by etchback (see FIG. 6C).

Then, boron ions are injected by ion implantation into the source/drain region, using the gate electrode 4 and the gate sidewalls 16, 17 as a mask. A source/drain 8 is then formed by boron activation by heat treatment (see FIG. 7A). Part of the gate sidewall 17 is then removed by isotropic dry etching or heated phosphoric acid (FIG. 7B).

Nickel sputtering and heat treatment are then carried out to produce a siliciding reaction on the upper surface of the source/drain to form nickel silicide 9 (see FIG. 7C). Excess nickel is removed by e.g., wet etching.

Then, as a tight adhering layer, a silicon nitride film 12 is formed (FIG. 8A). This silicon nitride film has a film thickness thinner than the height of the gate electrode 4, and is subjected to low compression stress. A silicon oxide film may be used as a tight adhering layer in place of the silicon nitride film 12. In this case, a film thickness of the gate oxide film in excess of 5 nm is more effective. Preferably, the film thickness is 10 nm or larger for increasing the on-current.

A silicon nitride film 10, subjected to high compression stress, is then formed on the p-MISFET to apply stress to the channel (see FIG. 8B). Contact plugs or interconnect layers are then formed.

With the fourth exemplary embodiment, tight adhering property may be improved due to the presence of the silicon nitride layer 12 as the tight adhering layer below the silicon nitride film 10 which is subjected to the high compression stress. The result is that the silicon nitride film in its entirety is hardly liable to peel off in the course of the LSI manufacturing process. This not only enables LSI manufacture to be completed satisfactorily, but also enables sufficient stress to be applied to the channel, thus achieving a high pMISFET performance.

Since the gate sidewall 16 is thinner in thickness, the distance between the silicon nitride film 10 having the high compression stress and the channel is correspondingly reduced, with a result that the channel stress becomes higher. Thus, the favorable result similar to that described in connection with the second exemplary embodiment may be achieved.

Fifth Exemplary Embodiment

The semiconductor device according to a fifth exemplary embodiment of the present invention is now described with reference to the drawings. FIGS. 9 and 10 depict schematic cross-sectional views for illustrating the process for manufacturing the semiconductor device according to the fifth exemplary embodiment of the present invention.

With the semiconductor device of the fifth exemplary embodiment, the source/drain region of the semiconductor device of the first exemplary embodiment is etched to a site (or level) lower (deeper) than the gate insulating film 3 (FIG. 10C). In other respects, the present exemplary embodiment is similar in configuration to the first exemplary embodiment.

The method for manufacturing the semiconductor device of the fifth exemplary embodiment is now described.

Figure 26B:
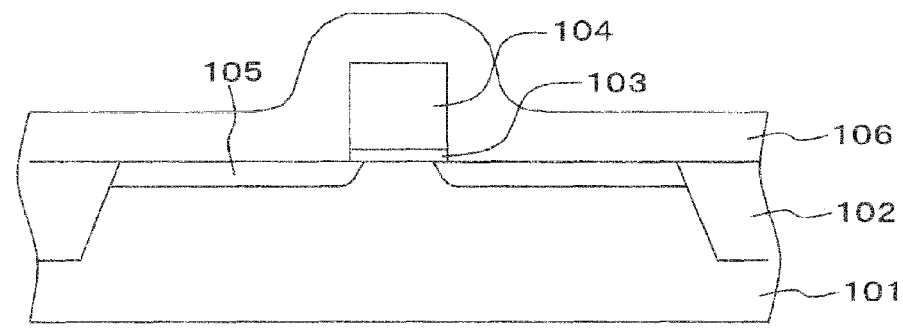
Figure 26C:
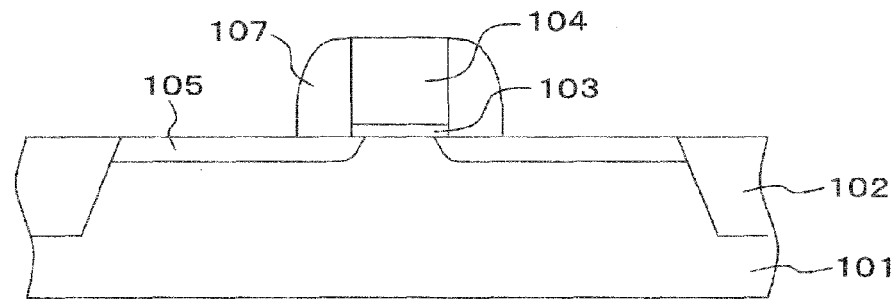
Figure 27A:
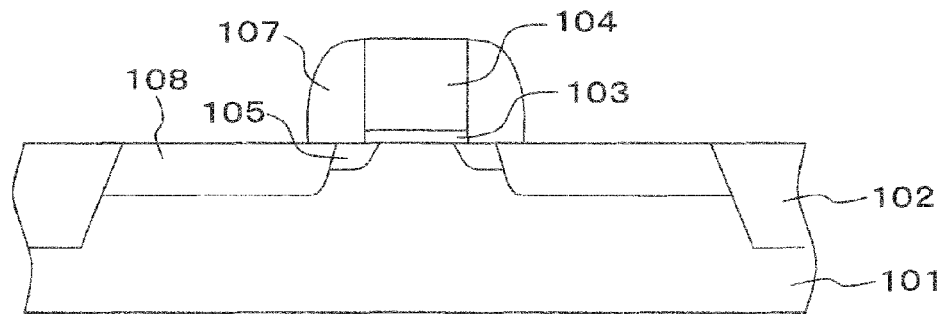
FIGS. 27A to 27C are cross-sectional views showing a second step schematically showing the method for manufacturing a semiconductor device according to the conventional technique.
Figure 27B:
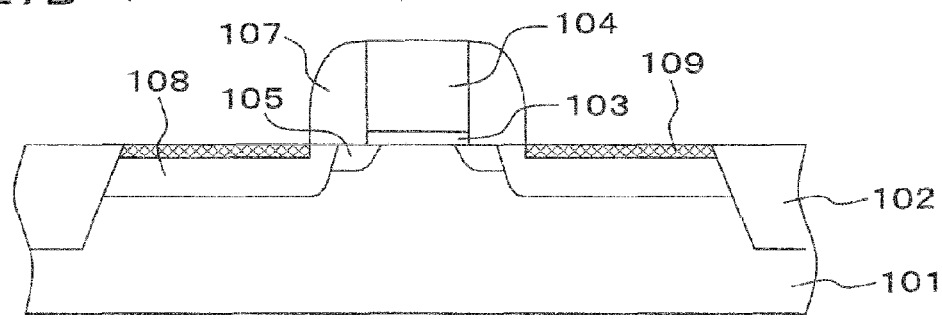
Figure 27C:
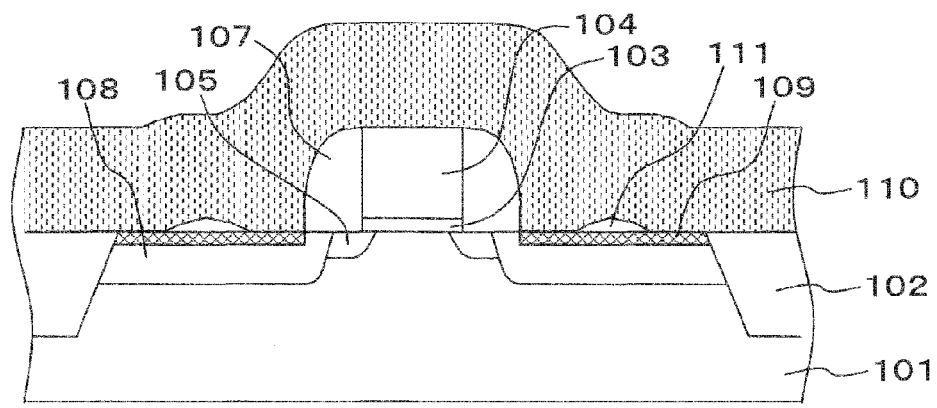

Initially, a device isolation region 2 is formed in an N-type silicon substrate 1, by a method similar to that used in the conventional technique (see FIGS. 26A to 26C). A gate insulating film and a gate electrode film are then deposited. A gate insulating film 3 and a gate electrode 4 are then formed by patterning. Then, using the gate electrode 4 as a mask, boron ions are injected by ion implantation to form a source/drain extension region 5. A silicon oxide film for a gate sidewall 7 is then caused to grow by CVD over the entire substrate surface. The gate sidewall 7 is then formed by etchback (see FIG. 9A).

The region of the silicon substrate 1 which is to become a source/drain of the silicon substrate 1 is then etched by isotropic dry etching to form a recess 18 (FIG. 9B). Then, using the gate electrode 4 and the gate sidewall 7 as a mask, boron ions are injected into the source/drain region by ion implantation. Heat treatment is then carried out for boron activation for forming a source/drain 8 (FIG. 9C)).

Nickel sputtering and heat treatment are then carried out to produce a siliciding reaction on the upper surface of the source/drain to form nickel silicide 9 (see FIG. 10A). Excess nickel is removed by e.g., wet etching.

Then, as a tight adhering layer, a silicon nitride film 12 is formed (see FIG. 10B). This silicon nitride film is thinner in film thickness than the height of the gate electrode 4 and subjected to low compression stress (see FIG. 10B). Meanwhile, a silicon oxide film may be used as a tight adhering layer in place of the silicon nitride film 12. In this case, a film thickness of the gate oxide film of at least 5 nm is more effective. Preferably, the film thickness is 10 nm or more for increasing the on-current.

Then, to stress the channel, a silicon nitride film 10, subjected to high compression stress, is formed on the pMOSFET (see FIG. 10C). Contact plugs, interconnect layers and so forth are then formed.

With the fifth exemplary embodiment, in which the silicon nitride film 12, operating as a tight adhering layer, is provided below the highly compressively stressed silicon nitride film 10, the tight adhering property is improved, such that the silicon nitride film 10 is not susceptible to peel-off. This enables LSI manufacture to be completed satisfactorily. Moreover, a sufficient stress may be applied to the channel, with a consequence that the high pMISFET performance can be achieved.

Since the source/drain region has been etched to (disposed at) a lower site (or level), the silicon nitride film 10 of high compression stress is closer to the channel, with a result that the channel can be stressed more strongly than in the case of the arrangement of the first exemplary embodiment.

Sixth Exemplary Embodiment

A semiconductor device according to a sixth exemplary embodiment of the present invention is now described with reference to the drawings. FIGS. 11 to 13 depict schematic cross-sectional views for illustrating the process for manufacturing the semiconductor device according to the sixth exemplary embodiment of the present invention.

With the semiconductor device of the sixth exemplary embodiment, the device isolation region 2 of the semiconductor device of the first exemplary embodiment has been etched to (disposed at) a lower site (or level) than the upper surface of the source/drain 8 (see FIG. 13B). The present exemplary embodiment is otherwise similar in its formulation to the first exemplary embodiment.

The method for manufacturing the semiconductor device according to the sixth exemplary embodiment is now described.

Initially, a device isolation region 2 is formed on an N-type silicon substrate 1, by a method similar to that of the conventional technique (see FIG. 26A). A gate insulating film and a gate electrode are then formed. A gate insulating film 3 and a gate electrode 4 are then formed by patterning. Then, using the gate electrode 4 as a mask, boron ions are injected by ion implantation to form a source/drain extension region 5 (FIG. 11A). The device isolation region 2 is then formed by etching to form a recess 19 (FIG. 11B). A silicon oxide film 6 then is formed thereon by CVD (FIG. 11C).

A gate sidewall 7 and a diffusion layer sidewall 7' are then formed by etchback (see FIG. 12A). Then, using the gate electrode 4 and the gate sidewall 7 as a mask, boron ions are injected by ion implantation into a source/drain region. Heat treatment is then carried out for boron activation for forming the source/drain 8 (FIG. 12B). Nickel sputtering and heat treatment are then carried out to produce a siliciding reaction on the upper surface of the source/drain 8 to form nickel silicide 9 (see FIG. 12C). Excess nickel is removed by e.g., wet etching.

Then, as a tight adhering layer, a silicon nitride film 12, thinner in film thickness than the height of the gate electrode 4, and subjected to low compression stress, is formed (see FIG. 13A). Meanwhile, a silicon oxide film may be used as a tight adhering layer in place of the silicon nitride film 12. In this case, a film thickness of the gate oxide film of at least 5 nm is more effective. Preferably, the film thickness is 10 nm or more for increasing the on-current.

Then, to stress the channel, a silicon nitride film 10, subjected to high compression stress, is formed on the pMOSFET (see FIG. 10B). Contact plugs, interconnect layers and so forth are then formed.

With the sixth exemplary embodiment, in which there the silicon nitride film 12, acting as a tight adhering layer, is provided below the highly compressively stressed silicon nitride film 10, the tight adhering property is improved, such that peeling-off of the silicon nitride film 10 is not liable to be produced. This enables LSI manufacture to be completed satisfactorily. Moreover, the stress may be applied sufficiently to the channel, with a consequence that a high pMISFET performance may be achieved.

Since the device isolation region 2 is etched to (disposed at) a deep site (or level), the silicon nitride film 10, subjected to a high compression stress, is formed so as to be turned around the side(s) of the source/drain 8. Since the compression stress is applied not only from the tight adhering region overlying the source/drain 8, but also from the lateral side of the source/drain 8, a higher stress may be applied to the channel than is possible with the formulation of the first exemplary embodiment.

Seventh Exemplary Embodiment

A semiconductor device according to a seventh exemplary embodiment of the present invention is now described with reference to the drawings. FIGS. 14 to 16 depict cross-sectional views for schematically illustrating the process for manufacturing the semiconductor device according to the seventh exemplary embodiment of the present invention.

The semiconductor device of the present seventh exemplary embodiment is a complementary MISFET composed of a pMISFET and an nMISFET (see FIG. 16B). The pMISFET side formulation in the semiconductor device of the seventh exemplary embodiment is similar to the first exemplary embodiment. On the nMISFET side of the semiconductor device of the seventh exemplary embodiment, the nMISFET is covered by a silicon nitride film 22 subjected to the tensile stress.

The method for manufacturing the semiconductor device according to the seventh exemplary embodiment is now described.

Initially, a device isolation region 2 is formed on a silicon substrate 1. An N-well 20 and a P-well 21 are then formed in preset regions of the silicon substrate. A gate insulating film and a gate electrode film are then deposited. A gate insulating film 3 and a gate electrode 4 are then formed by patterning. Then, using the gate electrode 4 as a mask, preset impurities are injected in accordance with the N-well 20 and the P-well 21 to form the source/drain extension region 5. A silicon oxide film for a gate sidewall 7 then is formed by CVD on the entire substrate surface. The gate sidewall 7 is then formed by etchback. Then, using the gate electrode 4 and the gate sidewall 7 as a mask, preset impurities are injected into the source/drain regions in accordance with the N-well 20 and the P-well 21. Heat treatment is then carried out to activate the impurities to form a source/drain 8. Nickel sputtering and heat treatment are then carried out to produce a siliciding reaction on the upper surface of the source/drain 8 to form nickel silicide 9 (see FIG. 14A). Excess nickel is removed by e.g., wet etching.

The silicon nitride film 22, subjected to the tensile stress, and the silicon oxide film 23, are then formed in this order (FIG. 14B). Meanwhile, since the silicon nitride film 22, subjected to the tensile stress, is highly adhesive tightly to the silicon oxide 9, direct film forming is also possible.

A photoresist film 24 is then applied by coating and, using the photolithographic technique, the portion of the photoresist film 24 in register with the pMISFET region is removed (see FIG. 14C).

Then, using the photoresist film 24 as a mask, the silicon oxide film 23 and the silicon nitride film 22, subjected to the tensile stress, are removed by anisotropic etching. The photoresist film 24 is then removed (see FIG. 15A). A silicon nitride film 12 is then formed as a tight adhering layer. This silicon nitride film 12 is thinner in thickness than the height of the gate electrode 4 and is subjected to a low compression stress. A silicon nitride film 10, subjected to a high compression stress, is then formed (see FIG. 15B). Meanwhile, a silicon oxide film may be used in place of the silicon nitride film 12 as the tight adhering layer. In this case, a film thickness of the silicon oxide film not less than 5 nm is more effective. The film thickness not less than 10 nm is desirable for increasing the on-current.

A photoresist film 25 is then applied by coating and, using the photolithographic technique, the portion of the photoresist film 25 overlying the nMISFET region is removed (see FIG. 15C). Then, using the photoresist film 25 as a mask, the silicon nitride film 10 and the silicon nitride film 12 are removed by anisotropic dry etching (see FIG. 16A). If the etching condition used is selective for the silicon nitride film 12, the silicon nitride film 22 in the nMISFET region, subjected to the tensile stress, is protected by the silicon oxide film 23 and hence is not etched. The photoresist film 25 is then removed.

Finally, the silicon oxide film 23, overlying the nMISFET, is removed (see FIG. 16B). This gives a structure in which the nMISFET is covered by the silicon nitride film 22, subjected to the tensile stress, and in which the pMISFET is covered with the silicon nitride film 10 subjected to the compression stress. Contact plugs, interconnect layers and so forth are then formed.

With the seventh exemplary embodiment, in which the silicon nitride film 12, acting as a tight adhering layer, is formed below the silicon nitride film 10 subjected to high compression stress, the tight adhering property is improved, while the silicon nitride film 10 is not liable to be peeled off. This enables LSI manufacture to be completed satisfactorily.

Moreover, the stress may be applied sufficiently to the channel, thus realizing a high pMISFET performance.

Eighth Exemplary Embodiment

A semiconductor device according to an eighth exemplary embodiment of the present invention is now described with reference to the drawings. FIGS. 17 to 19 depict schematic cross-sectional views for illustrating the process for manufacturing the semiconductor device according to the eighth exemplary embodiment of the present invention.

The semiconductor device of the present eighth exemplary embodiment is a complementary MISFET composed of a pMISFET and a nMISFET (see FIG. 19B). The pMISFET side formulation in the semiconductor device of the eighth exemplary embodiment is similar to that of the first exemplary embodiment. On the nMISFET side of the semiconductor device of the eighth exemplary embodiment, the nMISFET is covered by a silicon nitride film 22 subjected to the tensile stress. The method for manufacturing the semiconductor device of the eighth exemplary embodiment differs from the seventh exemplary embodiment in that the silicon nitride film 22 subjected to the tensile stress is deposited on the nMISFET side after forming the silicon nitride film 12 of the low compression stress and the silicon nitride film 10 of the high compression stress on the pMISFET side.

The method for manufacturing the semiconductor device according to the eighth exemplary embodiment is now described.

Initially, a device isolation region 2 is formed on a silicon substrate 1. An N-well 20 and a P-well 21 are then formed in preset regions of the silicon substrate. A gate insulating film and a gate electrode film are then deposited. A gate insulating film 3 and a gate electrode 4 are then formed by patterning. Then, using the gate electrode 4 as a mask, preset impurities are injected in keeping with the N-well 20 and the P-well 21 to form the source/drain extension region 5. A silicon oxide film for a gate sidewall 7 is then formed by CVD on the entire substrate surface. The gate sidewall 7 is then formed by etchback. Then, using the gate electrode 4 and the gate sidewall 7 as a mask, preset impurities are injected into the source/drain regions in keeping with the N-well 20 and the P-well 21. Heat treatment is then carried out to activate the impurities to form the source/drain 8. Nickel sputtering and heat treatment are then carried out to produce a siliciding reaction on the upper surface of the source/drain 8 to form nickel silicide 9 (see FIG. 17A). Excess nickel is removed by e.g., wet etching.

A silicon nitride layer 12 is then formed as a tight adhering layer. This silicon nitride layer has a film thickness thinner than the height of the gate electrode 4, and is subjected to the low compression stress. A silicon nitride layer 10, subjected to a high compression stress, is formed, and subsequently a silicon oxide film 23 is formed (FIG. 17B). Meanwhile, a silicon oxide film may be used as a tight adhering layer in place of the silicon nitride film 12. In this case, a film thickness exceeding 5 nm of the silicon oxide film is more effective. Preferably, the film thickness is 10 nm or more for increasing the on-current.

A photoresist film 26 is then applied by coating and, using the photolithographic technique, the portion of the photoresist film 26 overlying the nMISFET region is removed (see FIG. 17C). Then, using the photoresist film 26 as a mask, the silicon oxide film 23, the silicon nitride film 12, subjected to high compression stress, and the silicon nitride film 10, subjected to low compression stress, are removed by anisotropic dry etching. The photoresist film 26 is also removed (FIG. 18A). A silicon nitride film 22, subjected to the tensile stress, is then formed (FIG. 18B). Meanwhile, since the silicon nitride film 22, subjected to the tensile stress, exhibits a good adhering property with respect to nickel silicide 9, direct film forming is also possible.

A photoresist film 27 is then applied by coating and, using the photolithographic technique, the portion of the photoresist film 27 in register with the pMISFET region is removed (see FIG. 18C). Then, using the photoresist film 27 as a mask, the silicon nitride film 22, subjected to tensile stress, is removed by anisotropic dry etching (see FIG. 19A). If an etching condition used is selective for the silicon oxide film 23, the silicon nitride film 10 in the pMISFET region, subjected to the high compression stress, is not etched, because it is protected by the silicon oxide film 23. The photoresist film 27 is then removed.

Finally, the silicon oxide film 23, overlying the nMISFET, is removed. This gives a structure in which the nMISFET is covered by the silicon nitride film 22, subjected to the tensile stress, and in which the pMISFET is covered with the silicon nitride film 10 subjected to the high compression stress. Contact plugs, interconnect layers and so forth are then formed.

With the seventh exemplary embodiment, in which the silicon nitride film 12, acting as a tight adhering layer, is formed below the silicon nitride film 10 subjected to high compression stress, the tight adhering property is improved, while the silicon nitride film 10 is not susceptible to peel-off. This enables LSI manufacture to be completed satisfactorily. Moreover, the stress may be applied sufficiently to the channel, thus realizing the high pMISFET performance.

Examples

The meritorious effect of the first to eighth exemplary embodiments is now described based on test results obtained by the present inventors. FIGS. 20A to 20D depict partial cross-sectional views showing the structure of samples pertaining to Examples of the present invention and Comparative Examples. FIG. 21 shows, in a tabular form, the results of a checkerboard pattern tape test on a highly compressively stressed silicon nitride film on metal silicide.

By the checkerboard pattern tape test is meant such a test in which scars of a 10×10 checkerboard pattern, each of 1 mm in width, are formed on each of a plurality of test films by e.g., a diamond cutter, an adhesive tape is applied sufficiently strongly on each test film. Each test film is then peeled off. The number of the test films thus peeled off is then checked. The smaller the number of the films peeled off, the higher is the tight adhering property.

The results of the checkerboard pattern tape test have indicated that the lower the stress of the compressively stressed silicon nitride film, the more pronounced is the effect in improving the tight adhering property. The tight adhering property has been improved even in case a weakly compressively stressed silicon nitride film of 5 nm in thickness is sandwiched between nickel silicide and the strongly compressively stressed silicon nitride film. The tight adhering property has also been improved in case a silicon nitride film not less than 5 nm is sandwiched as described above. The film of this sort is termed a tight adhering film. It should be noted that no effect of improving the tight adhering property may be observed with a silicon oxide film 2.5 nm in thickness. This is possibly due to the fact that the silicon oxide film failed to sufficiently cover the surface of nickel silicide.

Figure 22:
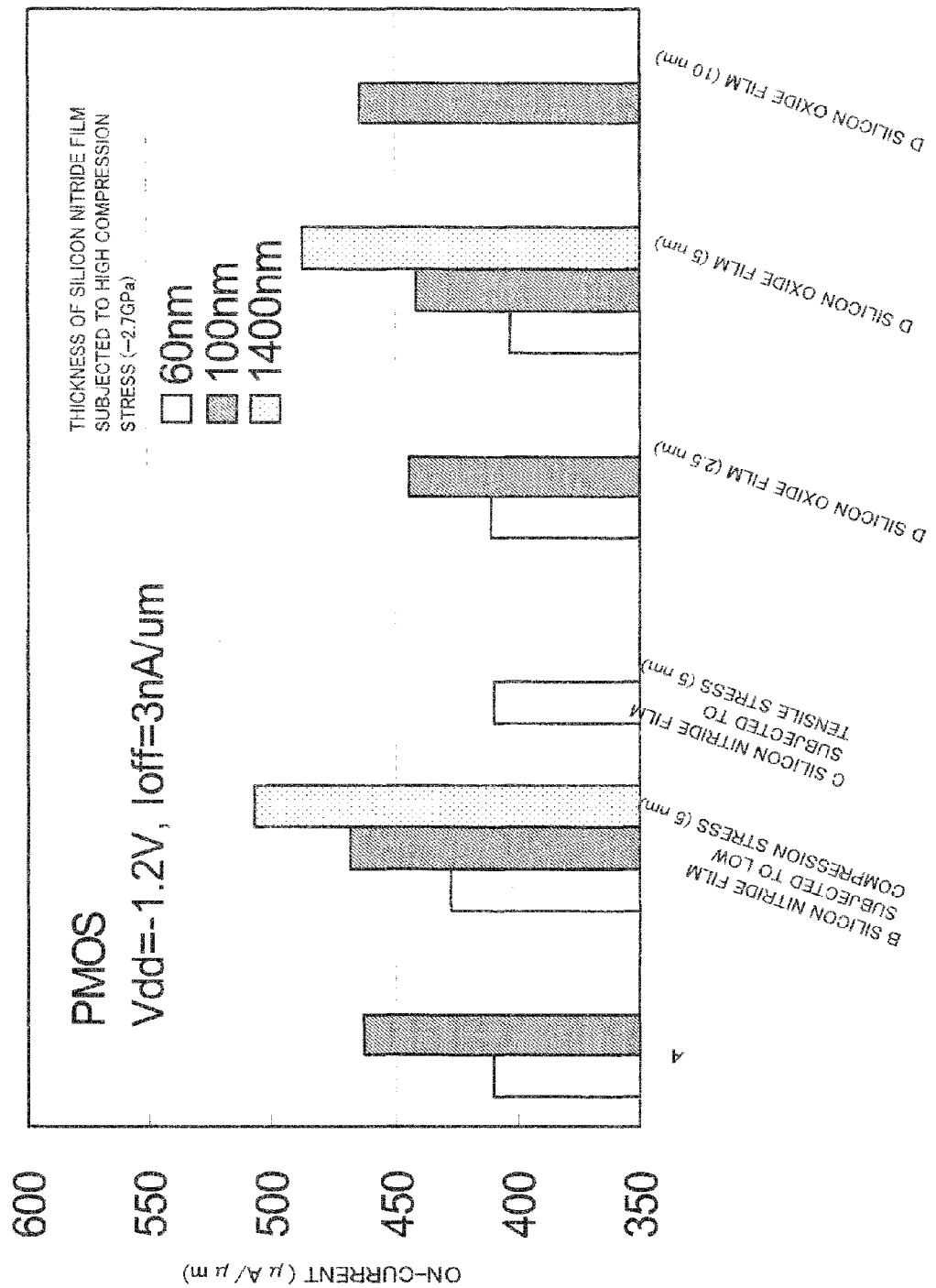
FIG. 22 is a bar graph showing the difference in the on-current of pMISFETs of respective different structures of the samples of Examples of the present invention and Comparative Examples.

The effect of the tight adhering film has on electrical characteristics of the MISFET has then been checked. FIG. 22 depicts a bar graph showing the difference in the on-currents of the pMISFETs of respective structures of the samples of the Examples of the present invention and the Comparative Examples.

As regards structure dependency, the on-current is slightly increased with a structure B including a tight adhering layer and a structure D as compared to a conventional structure A. The structure B includes a silicon nitride film of 5 nm of a low compression stress, while the structure D includes a silicon oxide film of 10 nm. This is in keeping with the result of the checkerboard pattern tape test insofar as insusceptibility to peel-off is concerned, and indication is that the higher the tight bonding property, the higher is the value of the on-current. Meanwhile, in case a structure C with the silicon nitride film of 5 nm of tensile stress is used as a tight adhering layer, the on-current is of substantially the same order of magnitude as that obtained with the conventional structure. This is presumably due to the fact that the current increase due to the improved tight adhering property is counterbalanced by current decrease caused by the stress of the opposite polarity.

Thus, if the silicon nitride film is used as a tight adhering layer, it is preferred to use a silicon nitride film subjected to a low compression stress. With the structure D and the silicon nitride film of 2.5 nm, no improvement may be observed both as to tight adhering property and as to on-current. This may be said to be ascribable to insufficient tight adhering property, as evidenced by the result of the checkerboard pattern tape test. Thus, with the silicon oxide film, the film thickness not less than 5 nm is preferred. In light of increasing the on-current, the film thickness is preferably not less than 10 nm.

The above results may be accounted for as follows: In the case of the conventional structure A, peel-off occurs on the interface between the metal silicide film and the silicon nitride film of high compression stress, on the upper surface of the source/drain of the MISFET, such that the stress is not effectively transmitted to the channel. Conversely, if the tight adhering layer is introduced, no peel-off is produced, so that the compression stress of the silicon nitride film may effectively be applied to the channel. It may thus be regarded that the on-current has been increased as compared to the case where no tight adhering layer is introduced.

Figure 23:
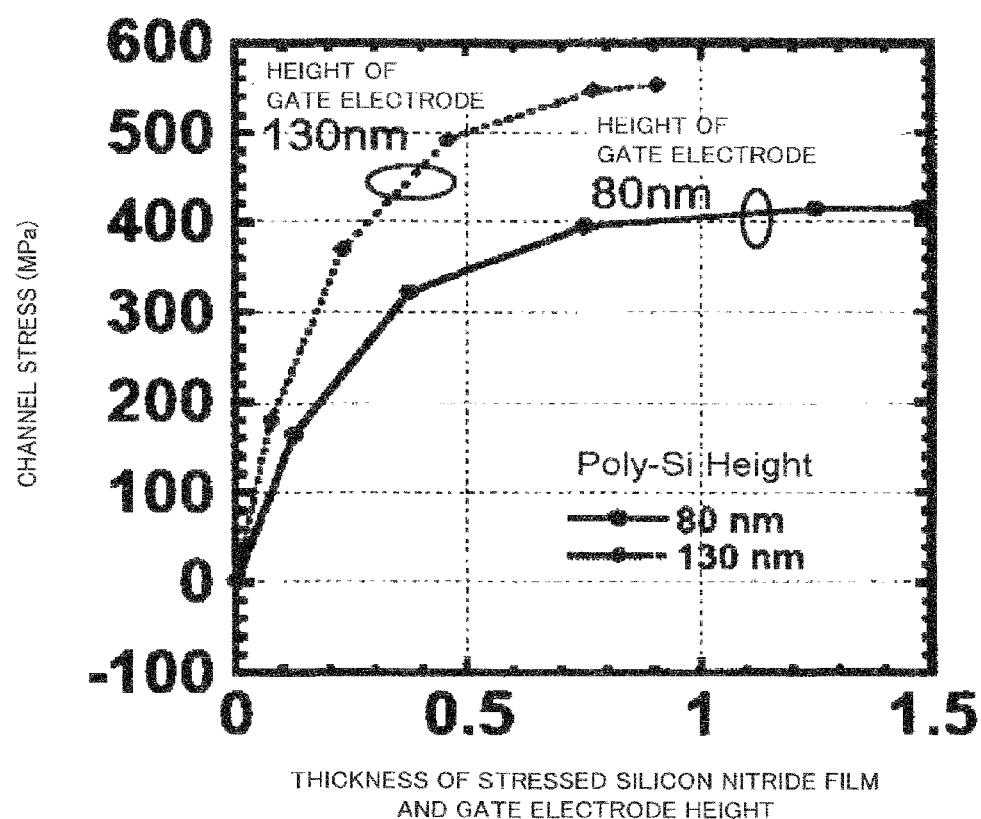
FIG. 23 is a graph showing the results of the simulation for the magnitudes of the stress of the channel by calculations for a case where a silicon nitride film with the stress of 12 GPa is formed on a MISFET.
Figure 25A:
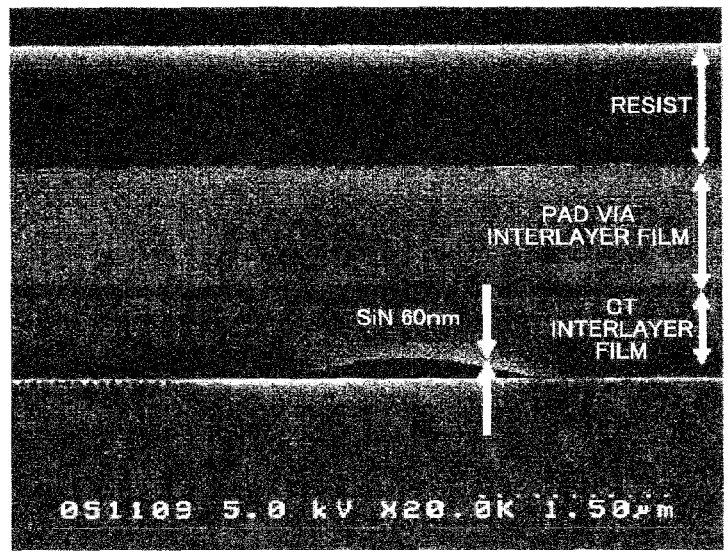
FIGS. 25A to 25B show images, as observed over a SEM, of the cross-section of a bubble part of a silicon nitride film.
Figure 25B:
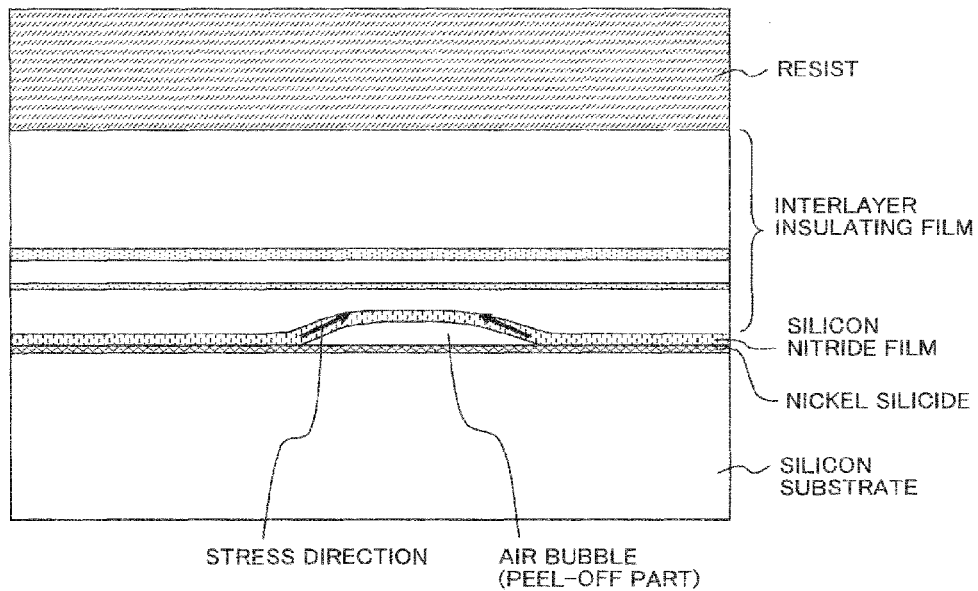

Next, inspection is now to be made on an upper limit of the film thickness of the tight adhering film. FIG. 23 shows the results of simulation of the magnitude of the channel stress by calculations in case a silicon nitride film subjected to a stress of 2 GPa is deposited on the MISFET.

When the film thickness of the stressed silicon nitride film exceeds the height of the gate electrode, the stress applied to the stress is saturated. This indicates that the portion of the silicon nitride film over the top of the gate electrode does not contribute to the channel stress. Thus, in case the thickness of the tight adhering layer exceeds the height of the gate electrode, no stress may be applied to the channel even though the silicon nitride film is formed to any greater height. The thickness of the tight adhering layer thus needs to be less than the height of the gate electrode at the maximum.

As a matter of principle, the force of linkage can be reinforced if the lower limit of the thickness of the tight adhering layer is equal to one atomic layer. In effect, however, the lower limit is thought to be determined by the rate of film coverage which in turn depends upon the film forming method used. That is, if island-like growth occurs at an earlier period of deposition of the tight adhering layer, the metal silicide film cannot sufficiently be covered, with a result that the metal silicide is contacted by a silicon nitride film of a low tight adhering property subjected to high compression stress. The present inventors have confirmed that, to improve the tight adhering property, the film thickness at least not less than 5 nm is effective both in the case of the silicon nitride film of low compressive force and in the case of the silicon oxide film. However, to improve the on-current as well, the film thickness of the tight adhering layer not less than 10 nm is desirable in case the tight adhering layer is the silicon oxide film. The film thickness of 5 nm of the tight adhering layer is also effective to improve the on-current in the case of the silicon nitride film subjected to low compression stress.

The particular exemplary embodiments or examples may be modified or adjusted within the gamut of the entire disclosure of the present invention, inclusive of claims, based on the fundamental technical concept of the invention. Further, variegated combinations or selection of elements disclosed herein may be made within the framework of the claims. That is, the present invention may encompass various modifications or changes that may occur to those skilled in the art in accordance with the within the gamut of the entire disclosure of the present invention, inclusive of claim and the technical concept of the present invention.

The invention claimed is:

1. A semiconductor device including a MISFET; said semiconductor device comprising:
    a first film that covers an entirety of said MISFET; said first film being of a film thickness thinner than the height of a gate electrode and consisting of a single layer of a same material; and
    a second film arranged on said first film; wherein
    said first film and said second film are films subjected to compressive stress;
    a compressive stress of said first film is lower than that of said second film; and
    gate sidewall spacers arranged on both sides of said gate electrode; said gate sidewall spacers being of a cross-sectional shape of an uppercase letter L,
    wherein said gate sidewall spacers with cross-sectional shape of an uppercase letter L directly contact said first film along an entirety of side of said gate sidewall spacers opposite said gate electrode.

2. The semiconductor device according to claim 1 wherein said second film is a silicon nitride film.

3. The semiconductor device according to claim 2 wherein said second film contains hydrogen.

4. The semiconductor device according to claim 1 wherein said first film is a silicon nitride film.

5. The semiconductor device according to claim 4 wherein said first film contains hydrogen.

6. The semiconductor device according to claim 1 wherein said first film is a silicon oxide film.

7. The semiconductor device according to claim 1 wherein said first film has a thickness not less than 5 nm.

8. The semiconductor device according to claim 7 wherein said first film has a thickness not less than 10 nm.

9. The semiconductor device according to claim 1 wherein said MISFET is a p-channel MISFET.

10. The semiconductor device according to claim 1 further comprising:
    a metal silicide film at an interface between said first film and said source/drain.

11. The semiconductor device according to claim 1 wherein said first and second films are removed at least in an area above said gate electrode.

12. The semiconductor device according to claim 1 further comprising:
a gate sidewall spacers arranged on both sides of said gate electrode; said gate sidewall spacers being lower in height than said gate electrode.

13. The semiconductor device according to claim 1 wherein said source/drain is sunk to a level lower than the gate insulating film lying below said gate electrode.

14. The semiconductor device according to claim 1 further comprising:
a device isolation region formed around said source/drain; said device isolation region being sunk to a level lower than an upper surface of said source/drain; and
a diffusion layer sidewall spacers formed on a lateral side of said source/drain.

15. A semiconductor device including a MISFET; said semiconductor device comprising:
a first film that covers at least a portion of an upper part of a source/drain of said MISFET; said first film being of a film thickness thinner than a height of a gate electrode and consisting of a single layer of a same material; and
a second film arranged on said first film; wherein
said first film is free of stress;
said second film is a film subjected to compressive stress; and
gate sidewall spacers arranged on both sides of said gate electrode; said gate sidewall spacers being of a cross-sectional shape of an uppercase letter L,
wherein said gate sidewall spacers with cross-sectional shape of an uppercase letter L directly contact said first film along an entirety of a side of said gate sidewall spacers opposite said gate electrode.

16. A semiconductor device including a MISFET; said semiconductor device comprising:
a first film that covers at least a portion of an upper part of a source/drain of said MISFET; said first film being of a film thickness thinner than a height of a gate electrode and consisting of a single layer of a same material; and
a second film arranged on said first film; wherein
said first film and said second film are silicon nitride films;
said first film has a nitrogen concentration higher than that of said second film; and
gate sidewall spacers arranged on both sides of said gate electrode, said gate sidewall spacers being of a cross-sectional shape of an uppercase letter L,
wherein said gate sidewall spacers with cross-sectional shape of an uppercase letter L directly contact said first film along an entirety of a side of said gate sidewall spacers opposite said gate electrode.

17. The semiconductor device according to claim 16 wherein said first film contains hydrogen.

18. The semiconductor device according to claim 16 wherein said second film contains hydrogen.

\* \* \* \* \*